(12) United States Patent
Lin

(10) Patent No.: US 12,394,677 B2
(45) Date of Patent: Aug. 19, 2025

(54) SEMICONDUCTOR STRUCTURE WITH OVERLAY MARK AND SYSTEM FOR MANUFACTURING THE SAME

(71) Applicant: NANYA TECHNOLOGY CORPORATION, New Taipei (TW)

(72) Inventor: Tsai-Wei Lin, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 205 days.

(21) Appl. No.: 18/219,846

(22) Filed: Jul. 10, 2023

(65) Prior Publication Data

US 2024/0071843 A1 Feb. 29, 2024

Related U.S. Application Data

(62) Division of application No. 17/898,116, filed on Aug. 29, 2022.

(51) Int. Cl.
*H01L 21/66* (2006.01)
*G03F 7/00* (2006.01)
*G03F 9/00* (2006.01)
*H01L 21/3213* (2006.01)
*H01L 21/768* (2006.01)
*H01L 23/544* (2006.01)

(52) U.S. Cl.
CPC .......... *H01L 22/30* (2013.01); *G03F 7/70* (2013.01); *G03F 9/7046* (2013.01); *H01L 21/76885* (2013.01); *H01L 22/12* (2013.01); *H01L 23/544* (2013.01); *H01L 21/32139* (2013.01); *H01L 2223/54426* (2013.01)

(58) Field of Classification Search
None
See application file for complete search history.

(56) References Cited

U.S. PATENT DOCUMENTS

2018/0350750 A1  12/2018  Chen et al.
2020/0278295 A1   9/2020  Hansen et al.
(Continued)

FOREIGN PATENT DOCUMENTS

TW  202042363 A  11/2020
TW  202132771 A   9/2021
TW  202138925 A  10/2021

OTHER PUBLICATIONS

Office Action mailed on Jan. 26, 2024 related to Taiwanese Application No. 112121864.

*Primary Examiner* — Alexander G Ghyka
(74) *Attorney, Agent, or Firm* — Xuan Zhang

(57) ABSTRACT

The present disclosure provides a semiconductor structure, a method of manufacturing the semiconductor structure and a system for manufacturing the semiconductor structure. The method includes several operations. A substrate including a device region and a scribe line region is provided. A first layer is formed over the substrate. A first photoluminescent layer is formed over the first layer in the scribe line region. The first layer and the first photoluminescent layer are patterned to form a first pattern in the scribe line region. A first patterned mask layer is formed over a second layer. An alignment of the first patterned mask layer with the first pattern is detected. A pattern of the first patterned mask layer is transferred to the second layer to form a second pattern in the scribe line region.

10 Claims, 29 Drawing Sheets

(56) References Cited

U.S. PATENT DOCUMENTS

2023/0266660 A1\* 8/2023 Wang .................... H01L 23/544
 430/5
2023/0266676 A1\* 8/2023 Wang ................... G01B 11/254
 430/5

\* cited by examiner

SEMICONDUCTOR STRUCTURE WITH OVERLAY MARK AND SYSTEM FOR MANUFACTURING THE SAME

CROSS-REFERENCE TO RELATED APPLICATION

This application is a divisional application of U.S. Non-Provisional application Ser. No. 17/898,116 filed 29 Aug. 2022, which is incorporated herein by reference in its entirety.

TECHNICAL FIELD

The present disclosure relates to a semiconductor structure, and a method of manufacturing the semiconductor structure. Particularly, the present disclosure relates to a semiconductor structure having an overlay mark including photoluminescent material, and a method of manufacturing the semiconductor structure.

DISCUSSION OF THE BACKGROUND

As the semiconductor industry develops, reducing overlay errors in photoresist patterns and underlying patterns in lithography operations becomes increasingly important. Since correctly measuring overlay errors has become more difficult due to various factors such as asymmetric shapes of measurement structures, a new overlay mark and a method which can more precisely measure overlay errors are required.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a method of forming a semiconductor structure. The method includes providing a substrate, including a device region and a scribe line region surrounding the device region; forming a first layer over the substrate; forming a first photoluminescent layer over the first layer in the scribe line region; patterning the first layer and the first photoluminescent layer to form a first pattern in the scribe line region; forming a first patterned mask layer over a second layer; detecting an alignment of the first patterned mask layer and the first pattern; and transferring a pattern of the first patterned mask layer to the second layer to form a second pattern in the scribe line region.

In some embodiments, the first photoluminescent layer includes rhodamine, imide, a fluorescent polyimide, or a combination thereof.

In some embodiments, the fluorescent polyimide includes triphenylamine ((C6H5)3N).

In some embodiments, the first photoluminescent layer is formed by one or more of deposition, sputtering, doping and coating.

In some embodiments, the first photoluminescent layer of the first pattern is exposed through the second pattern from a top view perspective.

In some embodiments, the first pattern surrounds the second pattern from a top view perspective.

In some embodiments, the first pattern encircles the second pattern from a top view perspective.

In some embodiments, the detecting the alignment of the first patterned mask layer and the first pattern comprises: providing a first optical signal on the first photoluminescent layer; receiving a second optical signal from the first photoluminescent layer; filtering the second optical signal; and converting the second optical signal to a first electrical signal.

In some embodiments, the detecting the alignment of the first patterned mask layer and the first pattern further comprises: providing a third optical signal on the patterned mask layer; receiving a fourth optical signal from the patterned mask layer; and converting the fourth optical signal to a second electrical signal.

In some embodiments, the first electrical signal and the second electrical signal are processed to show an alignment of the pattern of the first patterned mask layer and the first pattern.

In some embodiments, the first pattern includes conductive materials.

In some embodiments, the second pattern includes conductive materials.

In some embodiments, the first pattern and the second pattern are formed concurrently with an interconnection structure in the device region.

In some embodiments, the first pattern is formed concurrently with a layer of conductive trace of the interconnection structure.

In some embodiments, the second pattern is formed concurrently with a layer of conductive vias of the interconnection structure.

In some embodiments, the method further comprises: forming a second photoluminescent layer at a top of the second pattern.

In some embodiments, the method further comprises: forming a third layer over the second pattern; forming a second patterned mask layer over the third layer; and detecting an alignment of the second patterned mask layer and the second pattern.

In some embodiments, a top of the second patterned mask layer in the scribe line region is detected, and the second photoluminescent layer at the top of the second pattern is detected.

Another aspect of the present disclosure provides a system for forming a semiconductor structure. The system includes: a fabrication equipment, configured to perform operations to form a layer on a wafer; an exposure equipment, configured to perform patterning operations to form a pattern of the layer; and an alignment equipment, configured to detect an alignment of two overlay marks at different elevations. The alignment equipment comprises: a stage, configured to support a semiconductor structure; an optical device, configured to emit a radiation to excite a photoluminescent material of an overlay mark in a scribe line region of the semiconductor structure; an optical filter, configured to receive and filter the radiation emitted from the photoluminescent material; and an optical detector, configured to convert an optical signal filtered by the optical filter to an electrical signal.

In some embodiments, the alignment equipment is configured to generate an alignment result of the two overlay marks.

In some embodiments, the alignment equipment further includes: a first controller, electrically or signally connected to the optical device and the optical detector, and configured to process the electrical signal from the optical detector.

In some embodiments, the alignment equipment further includes: an interface, electrically connected to the controller and configured to display a result of the electrical signal after the electrical signal is processed by the controller.

In some embodiments, the optical filter includes a grating structure for the radiation entering through.

In some embodiments, a filtration range of wavelengths of the optical filter is different from a range of wavelengths of radiations emitted from the optical device.

In some embodiments, the optical detector outputs the electrical signal to a controller.

In some embodiments, the optical device emits a radiation having a wavelength in a range of near infrared (NIR), far infrared (FIR), ultraviolet (UV), near UV (NUV), far UV (FUV), green light, yellow light, red light, or a combination thereof.

In some embodiments, the system further includes a network, signally or electrically connected to the fabrication equipment, the exposure equipment, and the alignment equipment.

In some embodiments, the system further includes a second controller, electrically or signally connected to the fabrication equipment, the exposure equipment and the alignment equipment.

In some embodiments, the second controller is configured to generate an alignment result based on the electrical signal from the optical detector.

Another aspect of the present disclosure provides a semiconductor structure. The structure includes: a substrate, including a scribe line region and a device region; a first patterned layer, disposed over the substrate, wherein portions of the first patterned layer in the scribe line region define a first pattern and portions of the first patterned layer in the device region define a plurality of conductive traces; a first photoluminescent layer disposed at a top of the first pattern; and a second patterned layer, disposed over the first patterned layer, wherein portions of the second patterned layer in the scribe line region define a second pattern and portions of the second patterned layer in the device region define a plurality of conductive vias. The first photoluminescent layer is exposed through the second patterned layer from a top view perspective, and the plurality of conductive vias are electrically connected to the plurality of conductive traces.

In some embodiments, the semiconductor structure further includes a second photoluminescent layer, disposed at a top of the second pattern.

In some embodiments, a total thickness of the second pattern and the second photoluminescent layer is substantially equal to a thickness of one of the plurality of conductive vias.

In some embodiments, a thickness of the second patterned layer is greater than 10 microns ($\mu m$).

In some embodiments, a total thickness of the first pattern and the first photoluminescent layer is substantially equal to a thickness of one of the plurality of conductive traces.

In some embodiments, the semiconductor structure further includes a first dielectric layer, disposed between each of the plurality of the conductive traces; and a second dielectric layer, disposed between each of the plurality of the conductive vias.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
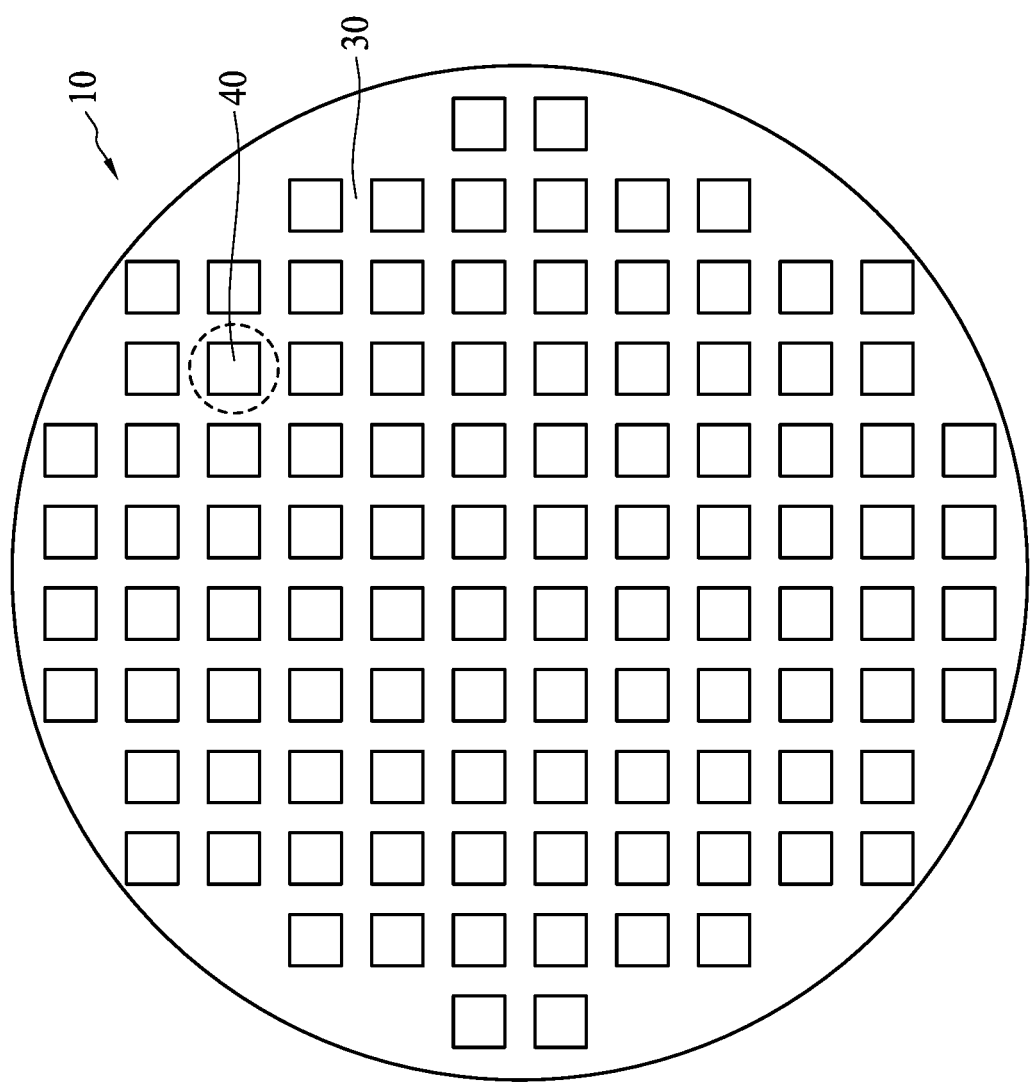
FIG. 1 is a schematic top view of a wafer in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
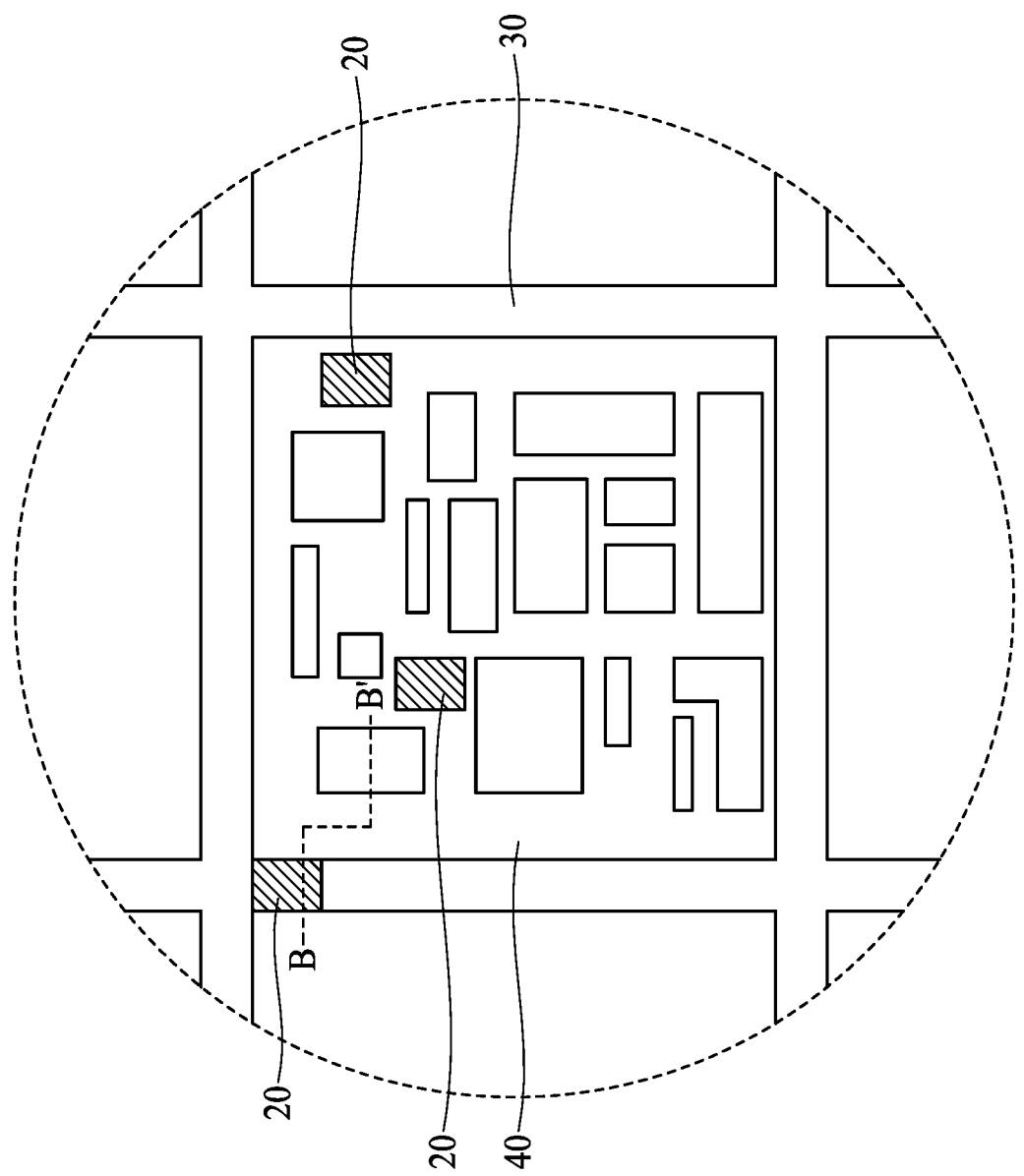
FIG. 2 is an enlarged schematic diagram of a dotted region as shown in FIG. 1 in accordance with some embodiments of the present disclosure.

Referring to FIG. 1 and FIG. 2, FIG. 1 is a top view of a wafer according to various aspects of the present disclosure, and FIG. 2 is an enlarged top view of a dotted region in FIG. 1.

As shown in FIG. 1 and FIG. 2, the wafer 10 includes a plurality of device regions 40 and a scribe line region 30 surrounding each of the device regions 40. In some embodiments, the plurality of device regions 40 define a plurality of dies. In some embodiments, the scribe line region 30 defines a plurality of scribe lines between the plurality of dies. For ease of illustration, the device regions 40 can be also referred to as dies 40, and the scribe line region 30 can be also referred to as scribe lines 30. The wafer 10 may be sawed along the scribe lines 30 into the plurality of dies 40. Each of the dies 40 may include semiconductor devices, which can include active components and/or passive components. The active components may include a memory die (e.g., a dynamic random-access memory (DRAM) die, a static random-access memory (SRAM) die, etc.), a power management die (e.g., a power management integrated circuit (PMIC) die), a logic die (e.g., system-on-a-chip (SoC), central processing unit (CPU), graphics processing unit (GPU), application processor (AP), microcontroller, etc.), a radio frequency (RF) die, a sensor die, a micro-electro-mechanical-system (MEMS) die, a signal processing die (e.g., a digital signal processing (DSP) die), a front-end die (e.g., an analog front-end (AFE) die) or other active components. The passive components may include a capacitor, a resistor, an inductor, a fuse or other passive components.

In some embodiments, an overlay mark 20 can be located on the scribe lines 30. In some embodiments, the overlay mark 20 can be disposed at a corner of an edge of each of the dies 40 on the scribe lines 30. In some embodiments, the overlay mark 20 can be located inside the dies 40. The overlay marks 20 can be used to measure whether a current layer (or an upper layer), such as an opening of a photoresist layer or a pattern of the photoresist layer, is precisely aligned with a pre-layer (or a lower layer) during a semiconductor fabrication process. The pre-layer can be located at a horizontal level different from a horizontal level of the current layer. In some embodiments, the current layer is disposed at an elevation higher than an elevation of the pre-layer.

Figure 3:
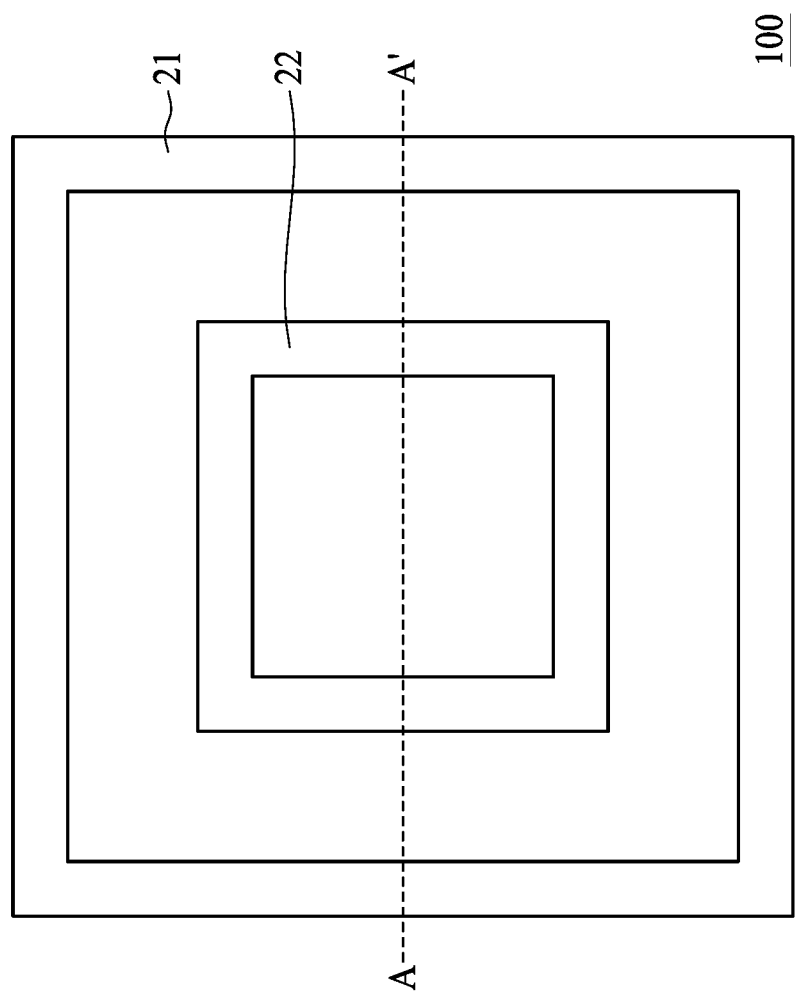
FIG. 3 is a schematic top view of overlay marks at different elevations in accordance with some embodiments of the present disclosure.

FIG. 3 is a top view showing alignment of an overlay mark 21 of the pre-layer and an overlay mark 22 of the current layer over a substrate 100 according to various aspects of the present disclosure.

In some embodiments, the wafer 10 includes the substrate 100. The substrate 100 may be a semiconductor substrate, such as a bulk semiconductor, a semiconductor-on-insulator (SOI) substrate, or the like. The substrate 100 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof.

In some embodiments, the alloy semiconductor substrate may be a SiGe alloy with a gradient Si:Ge feature in which Si and Ge compositions change from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. In some embodiments, the substrate 100 may have a multilayer structure, or the substrate 100 may include a multilayer compound semiconductor structure. In some embodiments, the substrate 100 includes semiconductor devices, electrical components, electrical elements or a combination thereof. In some embodiments, the substrate 100 includes transistors or functional units of transistors.

Figure 4:
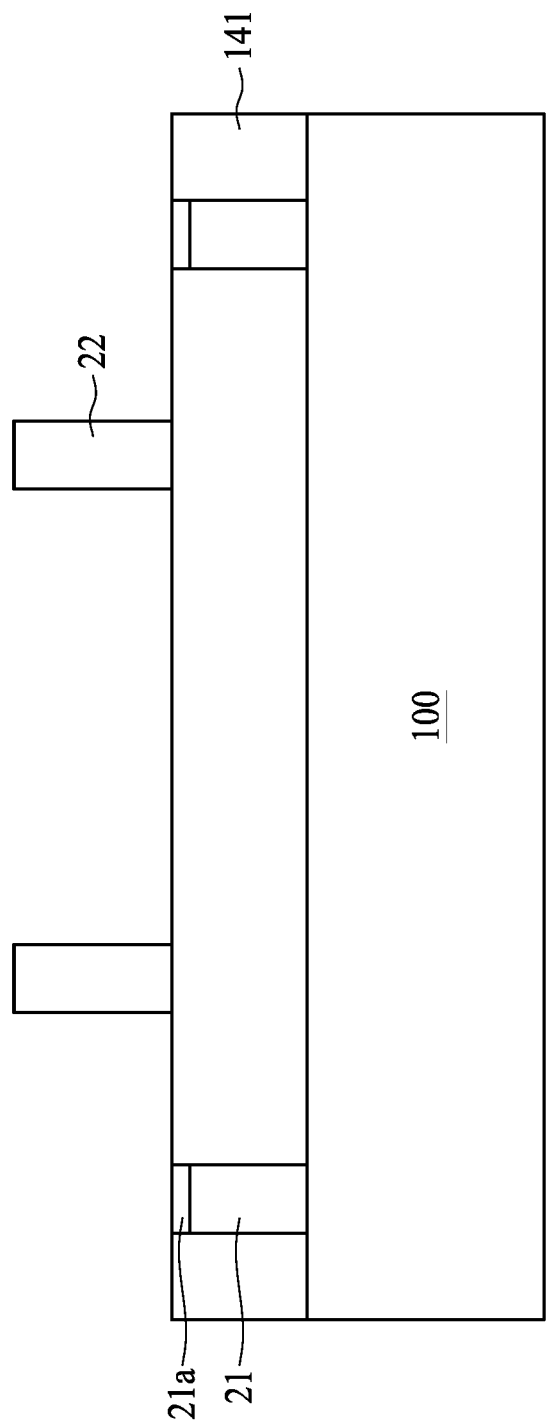
FIG. 4 is a schematic cross-sectional diagram along a line A-A' in FIG. 3 in accordance with some embodiments of the present disclosure.

FIG. 4 is a cross-sectional view taken along a cutting line A-A' of FIG. 3 in accordance with some embodiments of the present disclosure. As shown in FIG. 3 and FIG. 4, the overlay mark 21 can be disposed on the substrate 100. The overlay mark 21 can be disposed in an intermediate layer 141. The overlay mark 21 can represent an alignment of a pattern of the pre-layer or the lower layer disposed in the intermediate layer 141. A photoluminescent sublayer 21a can be disposed on top of the overlay mark 21. The photoluminescent sublayer 21a includes photoluminescent or fluorescent materials, and can provide a better view of the overlay mark 21, and an alignment between the overlay mark 21 and the overlay mark 22 can be easily examined. In some embodiments, the photoluminescent sublayer 21a is at a bottom of the overlay mark 21. In some embodiments, the photoluminescent sublayer 21a includes an organic material, an inorganic material or a combination thereof. In some embodiments, the inorganic material includes one or more of phosphor and quantum dot. In some embodiments, the organic material includes one or more of rhodamine, imide and a fluorescent polyimide. In some embodiments, the fluorescent polyimide includes an aromatic polyimide. In some embodiments, the fluorescent polyimide includes triphenylamine (($C_6H_5$)$_3$N).

In some embodiments, the overlay mark 21 may include a material same as a material of an isolation structure. In some embodiments, the overlay mark 21 may be disposed at an elevation same as an elevation of the isolation structure. The isolation structure can include, for example, a shallow trench isolation (STI), a field oxide (FOX), a local oxidation of silicon (LOCOS) feature, and/or other suitable isolation elements. The isolation structure can include a dielectric material such as silicon oxide, silicon nitride, silicon oxynitride, fluorosilicate glass (FSG), a low-k dielectric material, combinations thereof, and/or other suitable materials.

In some embodiments, the overlay mark 21 can include a material same as a material of a gate structure. The gate structure can be sacrificial, for example, such as a dummy gate structure. In some embodiments, the overlay mark 21 can be disposed at an elevation same as an elevation of the gate structure. In some embodiments, the overlay mark 21 can include a dielectric layer that includes a same material as a material of a gate dielectric layer and a conductive layer that includes a same material as a material of a gate electrode layer.

In some embodiments, the gate dielectric layer can include silicon oxide (SiOx), silicon nitride (SixNy), silicon oxynitride (SiON), or a combination thereof. In some embodiments, the gate dielectric layer can include dielectric material(s), such as high-k dielectric material. The high-k dielectric material may have a dielectric constant (k value) greater than 4. The high-k dielectric material may include hafnium oxide (HfO2), zirconium oxide (ZrO2), lanthanum oxide (La2O3), yttrium oxide (Y2O3), aluminum oxide (Al2O3), titanium oxide (TiO2) or another applicable material. Other suitable materials are within the contemplated scope of this disclosure.

In some embodiments, the gate electrode layer can include a polysilicon layer. In some embodiments, the gate electrode layer can be made of a conductive material, such as aluminum (Al), copper (Cu), tungsten (W), titanium (Ti), tantalum (Ta), or other applicable materials. In some embodiments, the gate electrode layer can include a work function layer. The work function layer is made of a metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof. Other suitable materials are within the contemplated scope of the disclosure. The gate electrode layer can be formed by low-pressure chemical vapor deposition (LPCVD) and plasma-enhanced CVD (PECVD).

In some embodiments, the overlay mark 21 can include a material same as a material of a conductive via, which can be disposed on a conductive trace, such as the first metal layer (M1 layer) of an interconnect structure. In some embodiments, the overlay mark 21 can include a material same as a material of the conductive trace, and the conductive trace can be disposed in a dielectric layer and electrically connected to the conductive trace. In some embodiments, the conductive trace and the conductive via are disposed in an interconnection structure disposed over the transistors of the substrate 100. In some embodiments, the conductive trace and the conductive via are disposed in a redistribution layer (RDL) disposed over the interconnection structure over the substrate 100.

In such embodiments, the overlay mark 21 can include a barrier layer and a conductive layer surrounded by the barrier layer. The barrier layer can include metal nitride or other suitable materials. The conductive layer can include metals, such as W, Ta, Ti, Ni, Co, Hf, Ru, Zr, Zn, Fe, Sn, Al, Cu, Ag, Mo, Cr, alloy or other suitable materials. In such embodiments, the overlay mark 21 can be formed by suitable deposition processes such as, for example, sputtering and physical vapor deposition (PVD).

The intermediate layer 141 can include insulating material, such as silicon oxide or silicon nitride. In some embodiments, the intermediate layer 141 can include conductive material, such as metal or alloy. In some embodiments, the intermediate layer 141 can be formed by a suitable film-forming method, such as chemical vapor deposition (CVD), atomic layer deposition (ALD) or physical vapor deposition (PVD). After the intermediate layer 141 is formed, a thermal operation, such as rapid thermal annealing, can be performed. In some embodiments, a planarization operation, such as a chemical mechanical polishing (CMP) operation, is performed.

In some embodiments, a removal operation, such as an etching process, can be performed. The etching process can include, for example, a dry etching process or a wet etching process. It should be noted that additional operations can be provided before, during, and after the processes set forth above, and some of the operations described above can be replaced or eliminated, for additional embodiments of the method. The order of the operations/processes are interchangeable.

In some embodiments, the overlay mark 22 is formed over the intermediate layer 141. In some embodiments, the overlay mark 22 is in physical contact with the intermediate layer 141. The overlay mark 22 can indicate an alignment of the current layer (or an upper layer) with the intermediate layer 141. In some embodiments, the overlay mark 22 is a portion of the current layer in the scribe line 30.

A material of the overlay mark 22 can be similar to or same as the material of the overlay mark 21, and repeated description is omitted herein. In some embodiments, the current layer is directly over the intermediate layer 141, and the overlay mark 22 is on the intermediate layer 141. In some embodiments, the overlay mark 22 is designed to indicate an alignment of the upper layer over the intermediate layer 141. In some embodiments, the upper layer is disposed over and separated from the intermediate layer 141.

Figure 5:
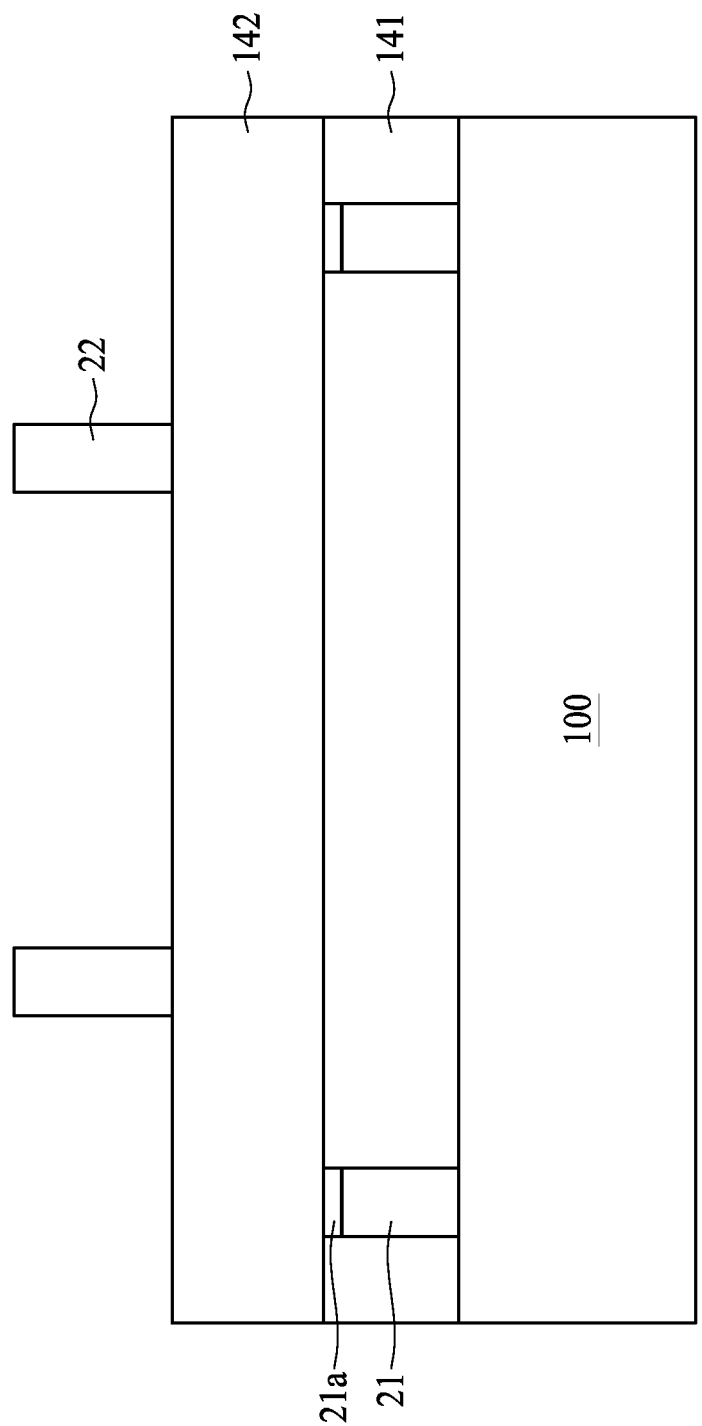
FIG. 5 is a schematic cross-sectional diagram along a line A-A' in FIG. 3 in accordance with some embodiments of the present disclosure.

FIG. 5 is a cross-sectional view taken along the cutting line A-A' of FIG. 3 in accordance with some embodiments of the present disclosure.

In some embodiments, an intermediate layer 142 is disposed over the overlay mark 21 and the intermediate layer 141. In some embodiments, the intermediate layer 142 is in physical contact with the overlay mark 21 and the intermediate layer 141. A material and/or a forming method of the intermediate layer 142 can be similar to or same as those of the intermediate layer 141, and repeated description is omitted herein. In some embodiments, the overlay mark 22 is disposed over the intermediate layer 142. The overlay mark 22 can be separated from the intermediate layer 141 by the intermediate layer 142. The overlay mark 22 can be disposed one or more layers above the overlay mark 21 and the intermediate layer 141, with any number of intermediate layers 142 disposed therebetween; the disclosure is not limited to only one intermediate layer 142. In some embodiments, a photoluminescent sublayer is included on top of the overlay mark 22.

Figure 6:
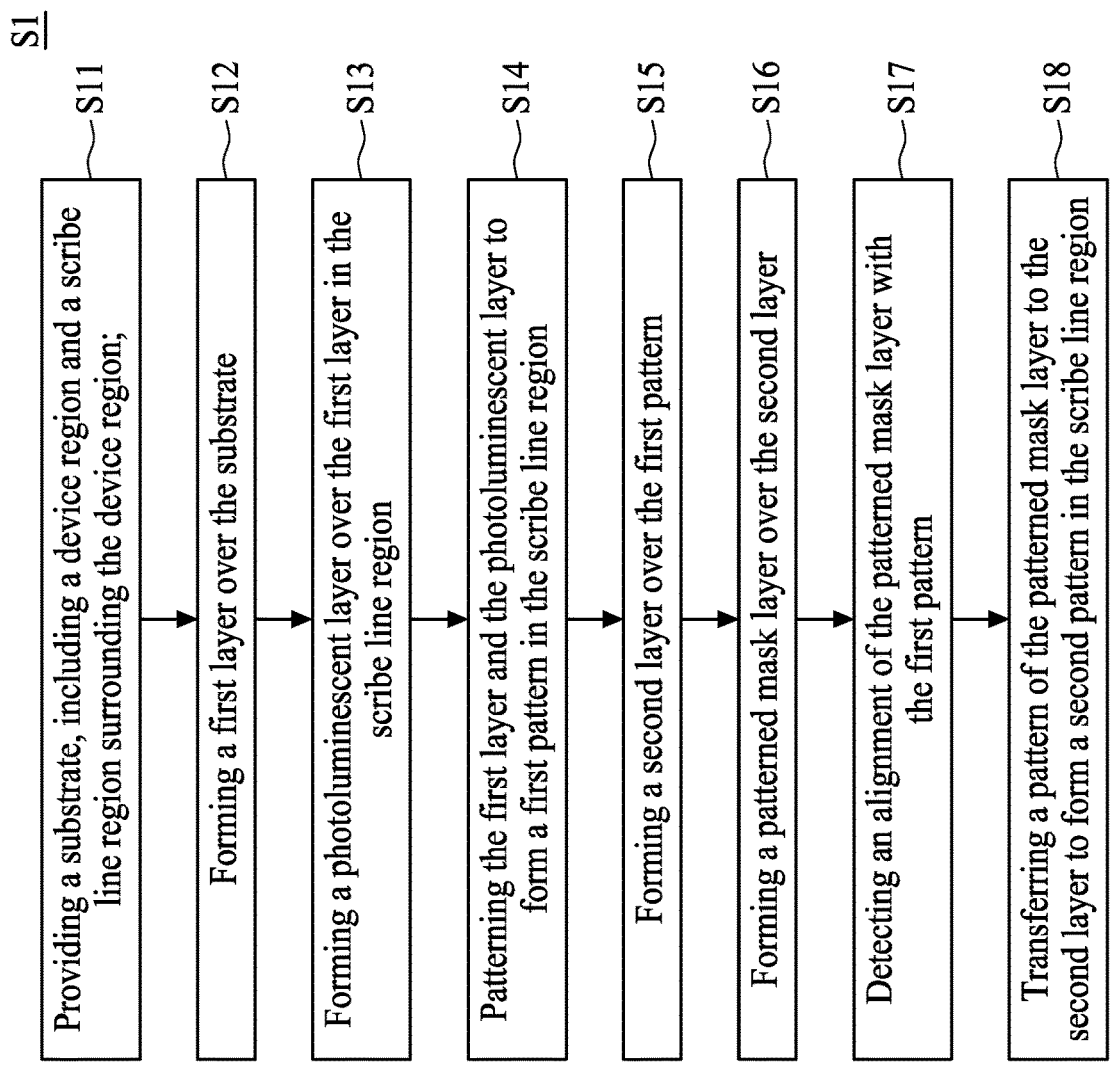
FIG. 6 is a flow diagram illustrating a method of manufacturing a semiconductor structure in accordance with some embodiments of the present disclosure.

FIG. 6 is a flow diagram of a method Si for manufacturing a semiconductor structure in accordance with some embodiments of the present disclosure. The method Si includes: (S11) providing a substrate, including a device region and a scribe line region surrounding the device region; (S12) forming a first layer over the substrate; (S13) forming a photoluminescent layer over the first layer in the scribe line region; (S14) patterning the first layer and the photoluminescent layer to form a first pattern in the scribe line region; (S15) forming a second layer over the first pattern; (S16) forming a patterned mask layer over the second layer; (S17) detecting an alignment of the patterned mask layer with the first pattern; and (S18) transferring a pattern of the patterned mask layer to the second layer to form a second pattern in the scribe line region.

Figure 7:
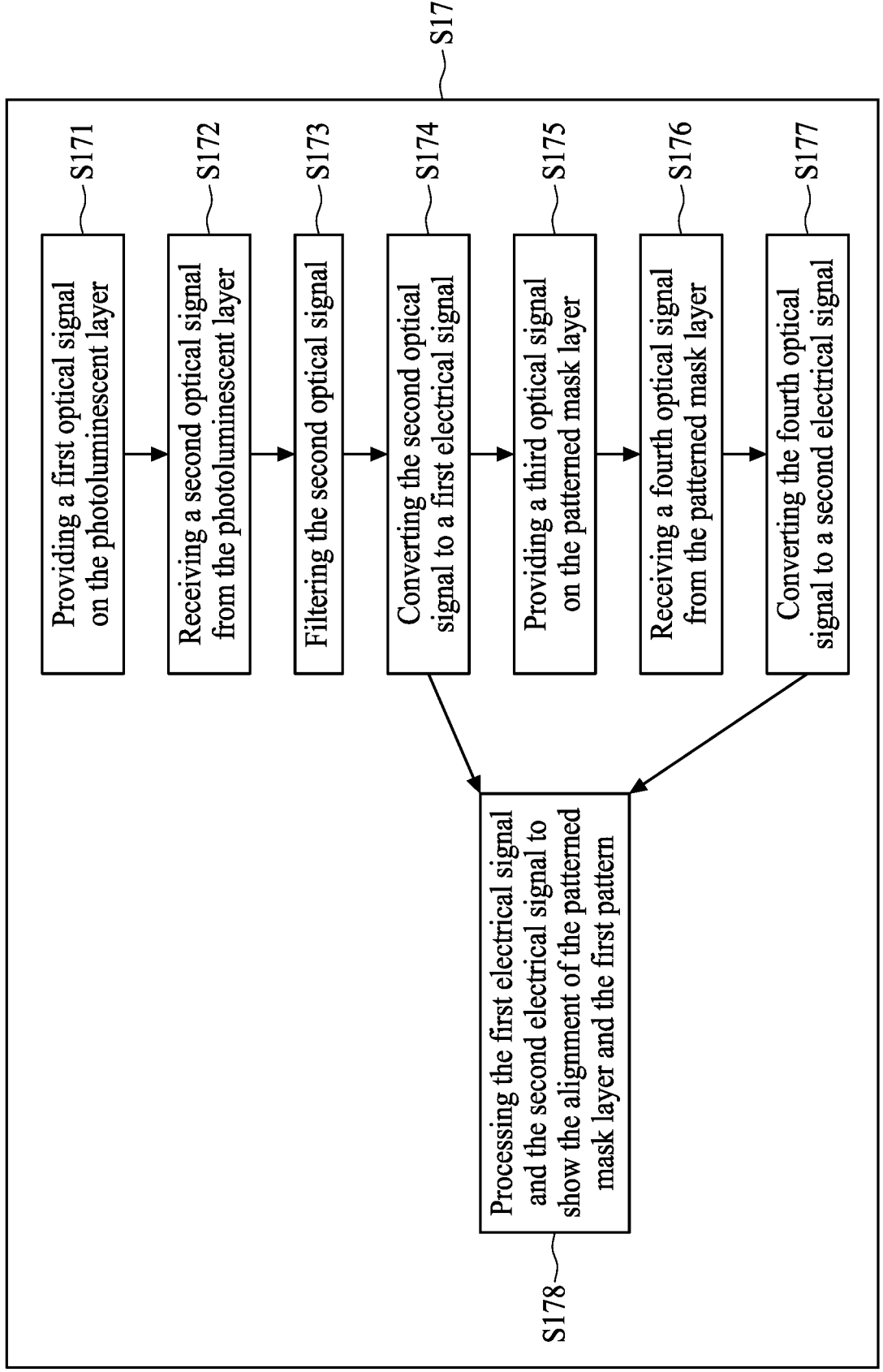
FIG. 7 is a flow diagram illustrating an operation of the method in FIG. 6 in accordance with some embodiments of the present disclosure.

FIG. 7 is a flow diagram of the operation S17 in accordance with some embodiments of the present disclosure. In some embodiments, the operation S17 includes several steps: (S171) providing a first optical signal on the photoluminescent layer; (S172) receiving a second optical signal from the photoluminescent layer; (S173) filtering the second optical signal; (S174) converting the second optical signal to a first electrical signal; (S175) providing a third optical signal on the patterned mask layer; (S176) receiving a fourth optical signal from the patterned mask layer; (S177) converting the fourth optical signal to a second electrical signal; and (S178) processing the first electrical signal and the second electrical signal to show the alignment of the patterned mask layer with the first pattern.

The method S1 includes a number of operations and steps and the description and illustration are not deemed as a limitation to the sequence of the operations and the steps. It should be noted that the operations of the method S1 may be rearranged or otherwise modified within the scope of the various aspects. Additional processes may be provided before, during, and after the method S1, and some other processes may be only briefly described herein. Thus, other implementations are possible within the scope of the various aspects described herein.

Figure 8:
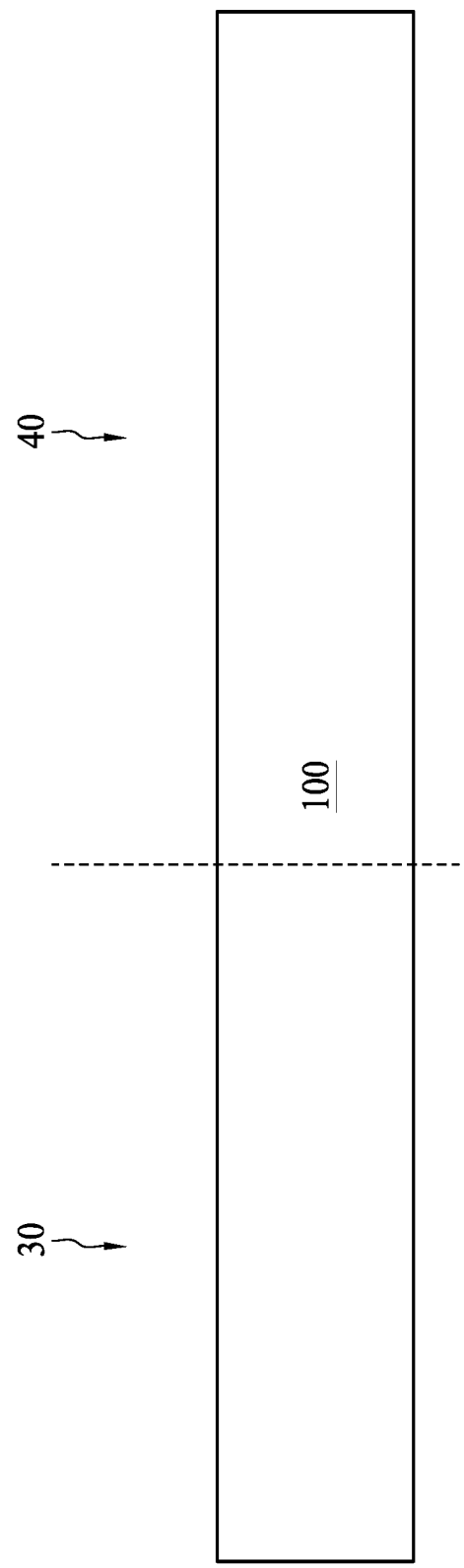
FIGS. 8 to 26 are cross-sectional diagrams of intermediate stages in the formation of a semiconductor structure in accordance with some embodiments of the present disclosure.

Referring to FIG. 8, which is a cross-sectional diagram taken along a line B-B' in FIG. 2 at a stage of the method Si in accordance with some embodiments of the present disclosure. In the operation S11, a substrate 100 is provided on a wafer 10. In some embodiments, the substrate 100 includes a plurality of device regions 40 and a scribe line region 30. The scribe line region 30 may surround the device regions 40, and the device regions 40 are separated by the scribe line region 30 from a top view as shown in FIG. 1.

Figure 9:
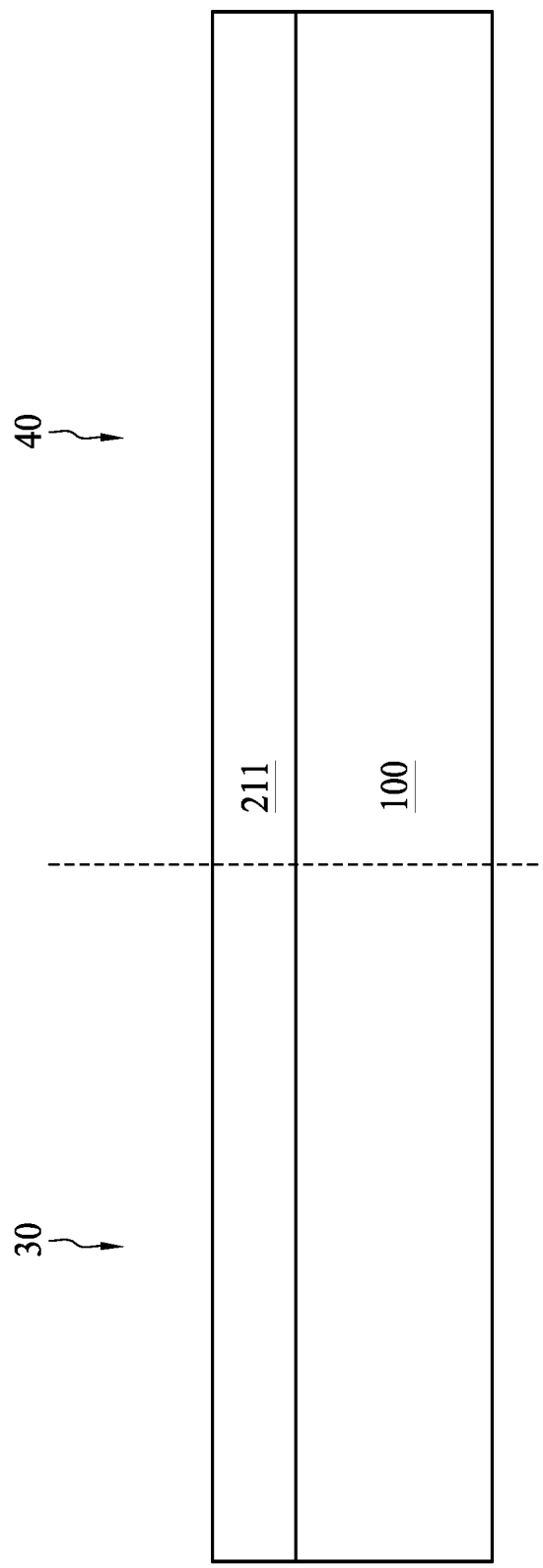

Referring to FIG. 9, which is a cross-sectional diagram taken along the line B-B' in FIG. 2 at a different stage of the method S1 in accordance with some embodiments of the present disclosure. In the operation S12, a first layer 211 is formed over the substrate 100. The first layer 211 may be a lower layer represented by an overlay mark 21 formed in subsequent processing. In some embodiments, the first layer 211 is a conductive layer of an interconnection structure formed over the substrate 100 for electrical connection to transistors and/or electrical components in the substrate 100.

Figure 10:
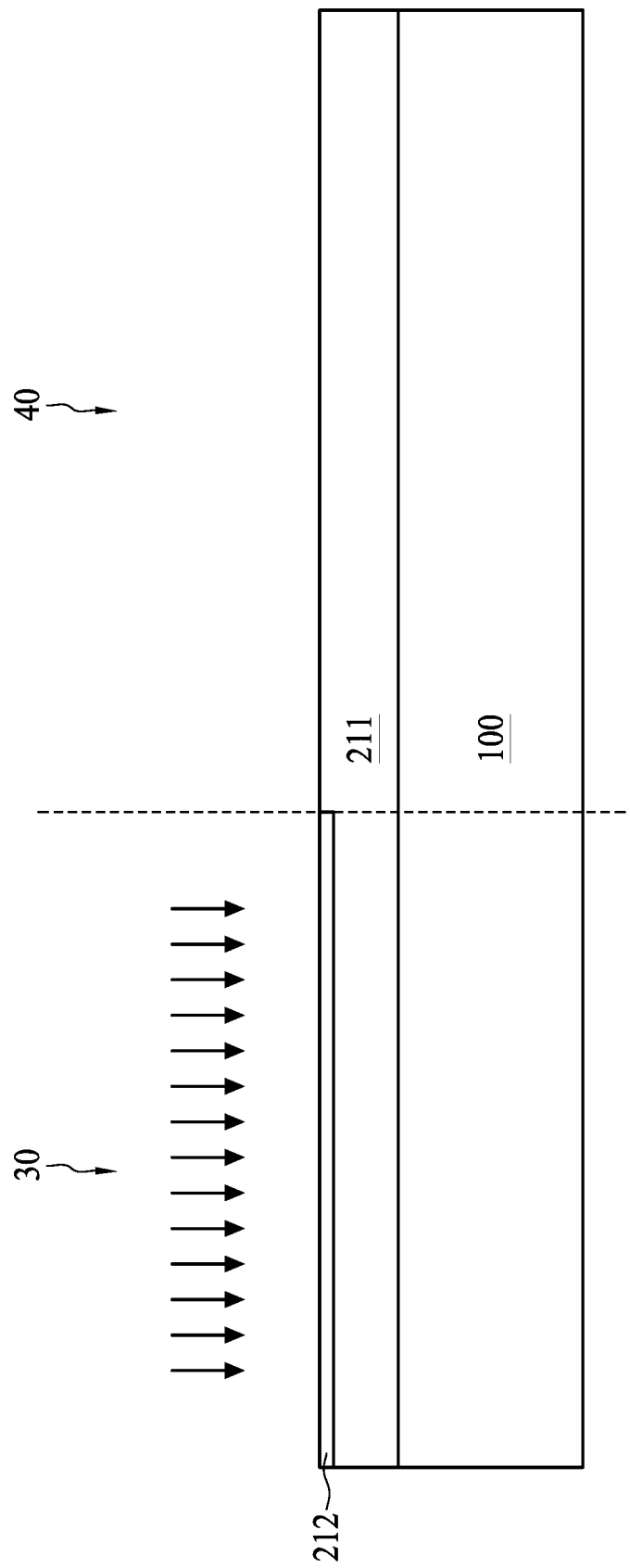

Referring to FIG. 10, which is a cross-sectional diagram taken along the line B-B' in FIG. 2 at a different stage of the method S1 in accordance with some embodiments of the present disclosure. In the operation S13, a photoluminescent layer 212 is formed over the first layer 211. In some embodiments, the photoluminescent layer 212 is formed only in the scribe line region 30. In some embodiments, the photoluminescent layer 212 includes an organic material, an inorganic material or a combination thereof. In some embodiments, the inorganic material includes one or more of phosphor and quantum dot. In some embodiments, the organic material includes one or more of rhodamine, imide and a fluorescent polyimide. In some embodiments, the fluorescent polyimide includes an aromatic polyimide. In some embodiments, the fluorescent polyimide includes triphenylamine (($C_6H_5$)$_3$N). The photoluminescent layer 212 is formed by sputtering, doping, coating and/or deposition. In some embodiments, the photoluminescent layer 212 is formed by sputtering, coating and/or deposition, and is formed over the first layer 211. In some embodiments, the photoluminescent layer 212 is formed by doping, and is formed at a top of the first layer 211 as shown in FIG. 10.

In some embodiments, the photoluminescent layer 212 is formed over the substrate 100 prior to the formation of the first layer 211. In such embodiments, the photoluminescent layer 212 is formed by sputtering, coating and/or deposition.

Figure 11:
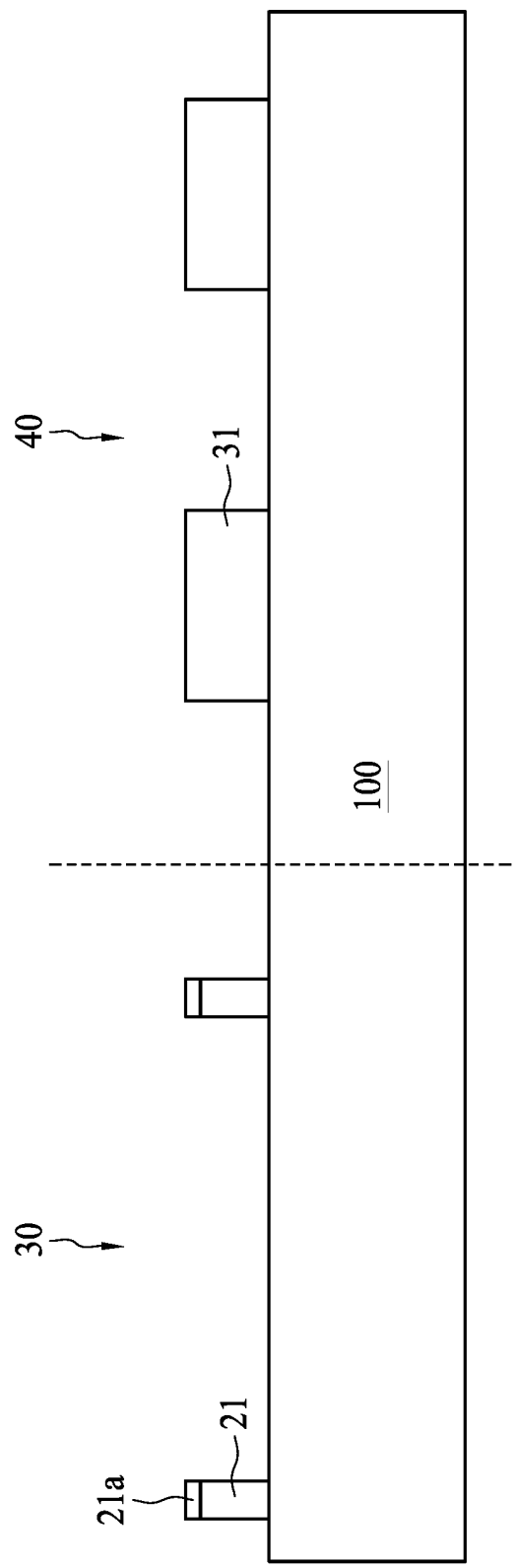

Referring to FIG. 11, which is a cross-sectional diagram taken along the line B-B' in FIG. 2 at a different stage of the method S1 in accordance with some embodiments of the present disclosure. In the operation S14, the first layer 211 and the photoluminescent layer 212 are patterned to form a first pattern 21 in the scribe line region 30. In some embodiments, the photoluminescent layer 212 is patterned to form a photoluminescent sublayer 21a at a top of the first pattern 21. In some embodiments, the first pattern 21 may be referred to as an overlay mark 21. In some embodiments, the first layer 211 in the device region 40 is patterned to form a plurality of conductive traces 31 of the interconnection structure. In some embodiments, a thickness of the first pattern 21 (including the photoluminescent sublayer 21a) is substantially equal to a thickness of one of the plurality of conductive traces 31.

In the embodiments where the photoluminescent layer 212 is formed prior to the formation of the first layer 211, the photoluminescent sublayer 21a is formed at a bottom of the first pattern 21.

Figure 12:
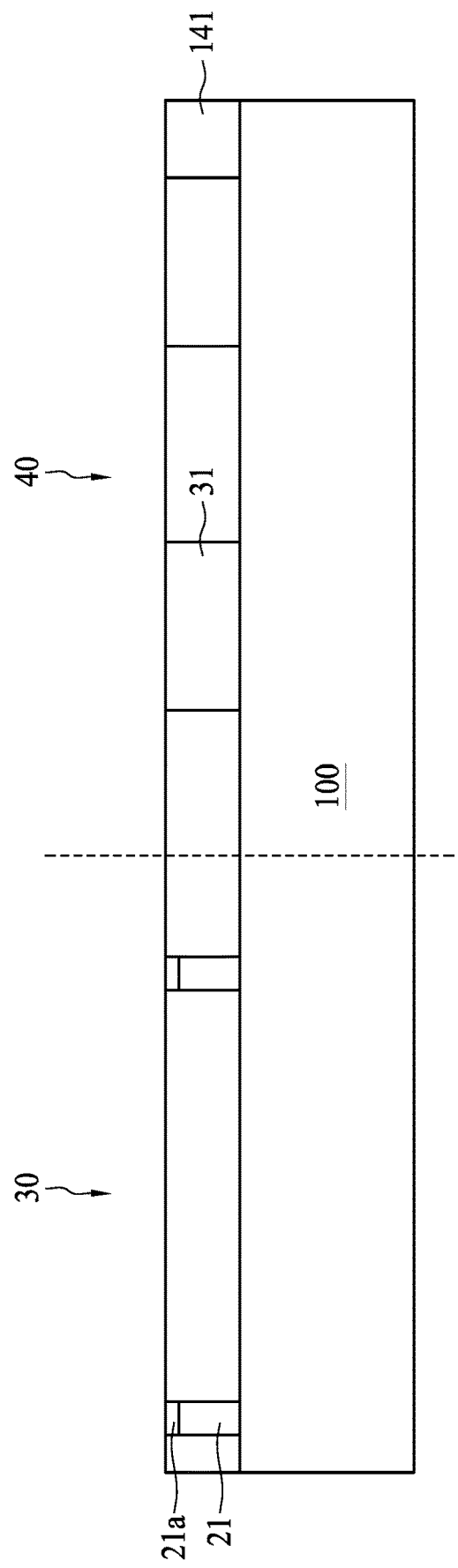

Referring to FIG. 12, which is a cross-sectional diagram taken along the line B-B' in FIG. 2 at a different stage of the method S1 in accordance with some embodiments of the present disclosure. After the operation S14, an intermediate layer 141 is formed over the substrate 100. In some embodiments, the intermediate layer 141 is a dielectric layer of the interconnection structure for providing electrical isolation between different electric paths of the interconnection structure.

In some embodiments, the dielectric layer includes dielectric materials similar to or same as dielectric materials of the isolation structure described above. In some embodiments, the intermediate layer 141 is formed by deposition. In some embodiments, a planarization is performed until the conductive traces 31 are exposed. The intermediate layer 141 may be disposed between each of the conductive traces 31, and also between the first pattern 21 and the plurality of conductive traces 31. The intermediate layer 141 may also be disposed between portions of the first pattern 21.

Figure 13:
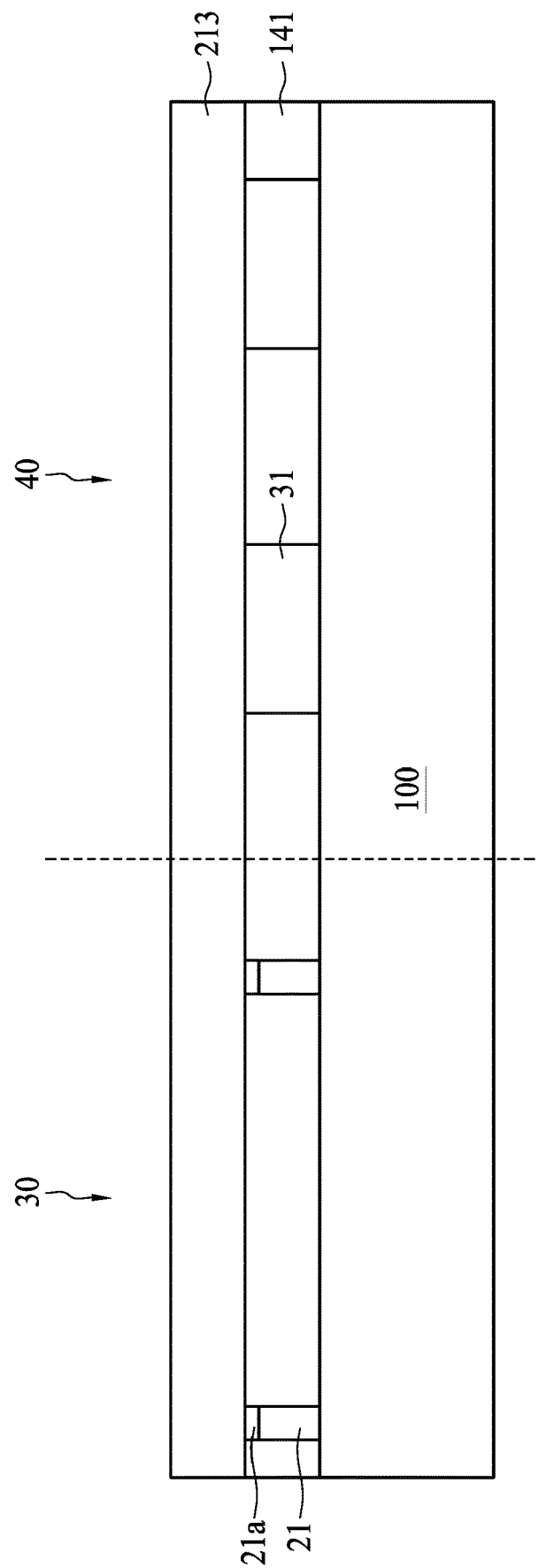

Referring to FIG. 13, which is a cross-sectional diagram taken along the line B-B' in FIG. 2 at a different stage of the method S1 in accordance with some embodiments of the present disclosure. In the operation S15, a second layer 213 is formed over the first pattern 21. In some embodiments, the second layer 213 is formed on the intermediate layer 141 and the conductive traces 31. In some embodiments, the second layer 213 is a conductive layer. In some embodiments, the second layer 213 includes a material similar to or same as a material of the first layer 211.

Figure 14:
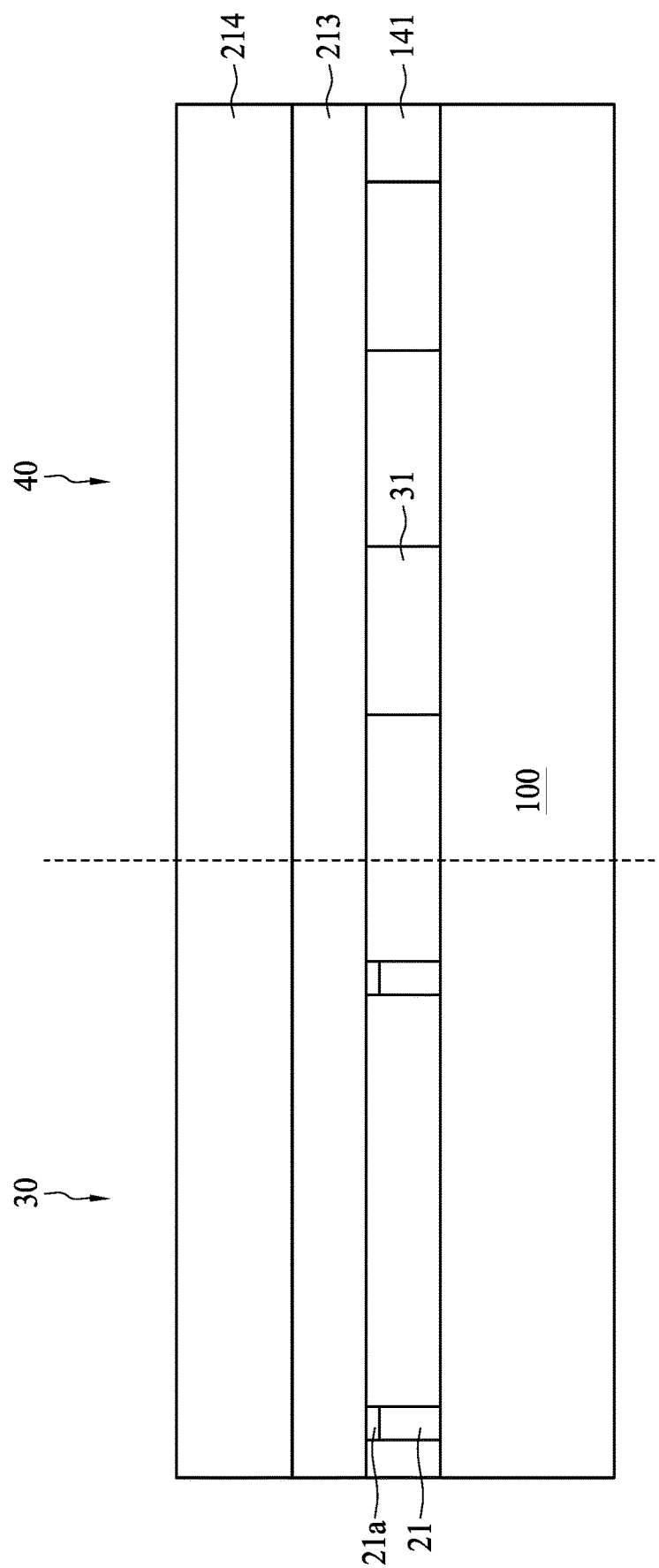
Figure 15:
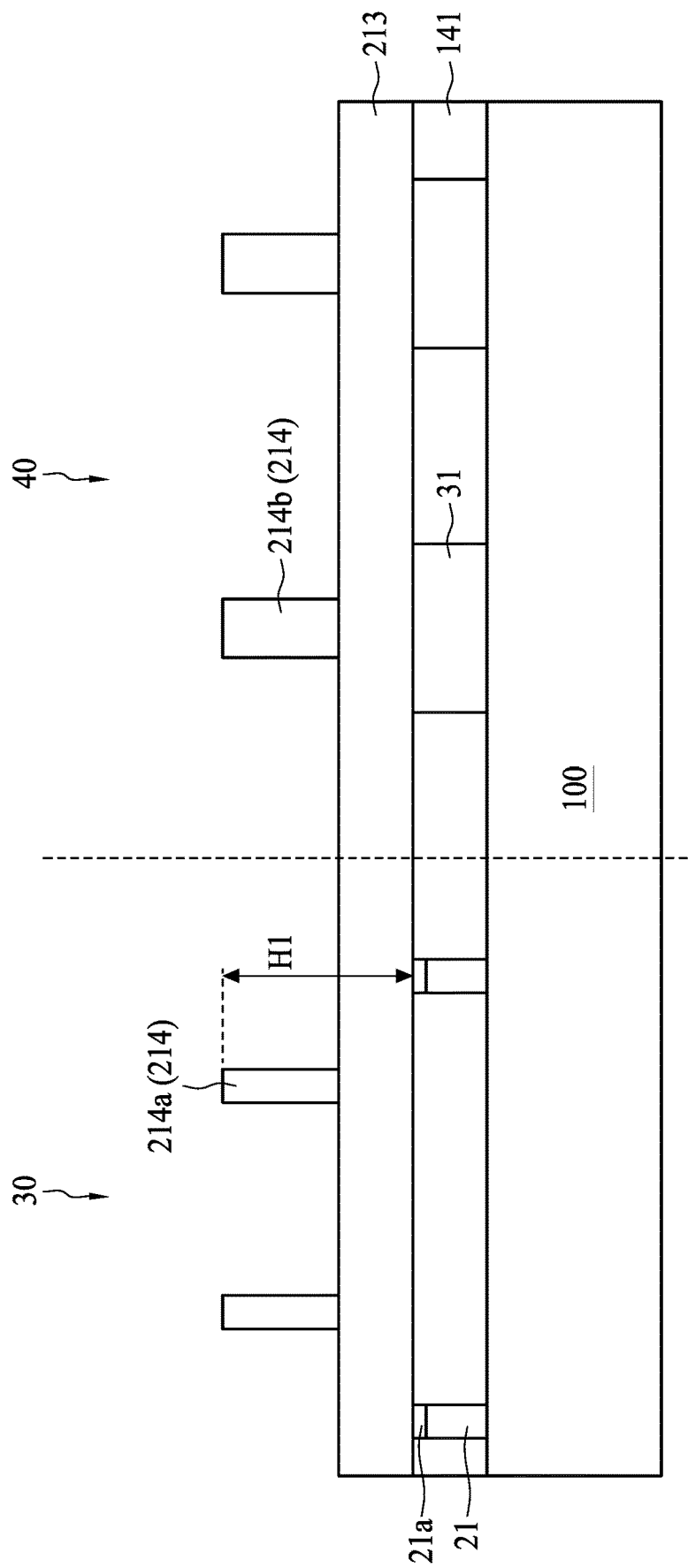

Referring to FIGS. 14 to 15, which are cross-sectional diagrams taken along the line B-B' in FIG. 2 at different stages of the method Si in accordance with some embodiments of the present disclosure. In the operation S16, a mask layer 214 is formed and patterned. In some embodiments, the mask layer 214 includes photosensitive materials. In some embodiments, the mask layer 214 is a photoresist layer. In some embodiments, the patterned mask layer 214 includes first portions 214a in the scribe line region 30 and second portions 214b in the device region 40.

In some embodiments, the first portions 214a may define an overlay mark 22 to be formed in the scribe line region 30.

In some embodiments, a distance H1 between a top of the first portions 214*a* and a top of the first pattern 21 is greater than 10 microns (μm). In some embodiments, the distance H1 is greater than a depth of focus (DOF) of a detector or an apparatus. In some embodiments, a thickness of the second layer 213 is greater than the DOF of the detector or the apparatus. In some embodiments, the thickness of the second layer 213 is greater than 10 μm.

In some embodiments, the second portions 214*b* define conductive vias to be formed in the device region 40. In some embodiments, the first portions 214*a* are surrounded by the first pattern 21 from a top view perspective (a position and configuration of the first portions 214*a* can be similar to or same as a position and configuration of the overlay mark 22 as shown in FIG. 3). In some embodiments, the first portions 214*a* are encircled by the first pattern 21 from the top view perspective.

Figure 16:
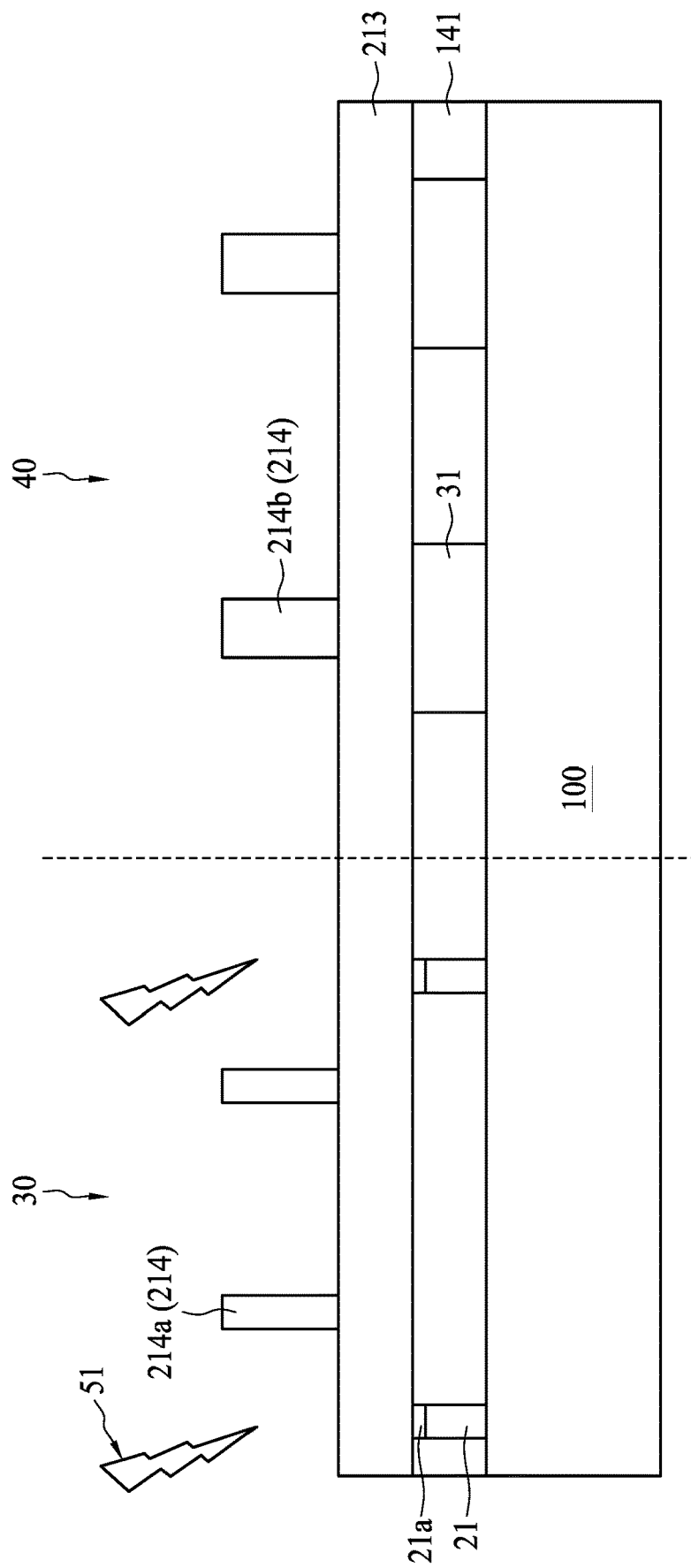

Referring to FIG. 16, which is a cross-sectional diagram taken along the line B-B' in FIG. 2 at a different stage of the method S1 in accordance with some embodiments of the present disclosure. In the step S171 of the operation S17, a first optical signal 51 is provided on the photoluminescent sublayer 21*a* of the first pattern 21. In some embodiments, the first optical signal 51 is provided in both the scribe line region 30 and the device region 40.

A wavelength of the first optical signal 51 can be within a range of wavelengths of near infrared (NIR), far infrared (FIR), ultraviolet (UV), near UV (NUV), far UV (FUV), green light, yellow light, red light, or a combination thereof. In some embodiments, the first optical signal 51 is provided on the entire substrate 100. The photoluminescent or fluorescent material of the photoluminescent sublayer 21*a* can be excited by the first optical signal 51. Electrons of the excited photoluminescent or fluorescent material return to ground states from excited states, and radiation is emitted on the return of the electrons to the ground state.

Figure 17:
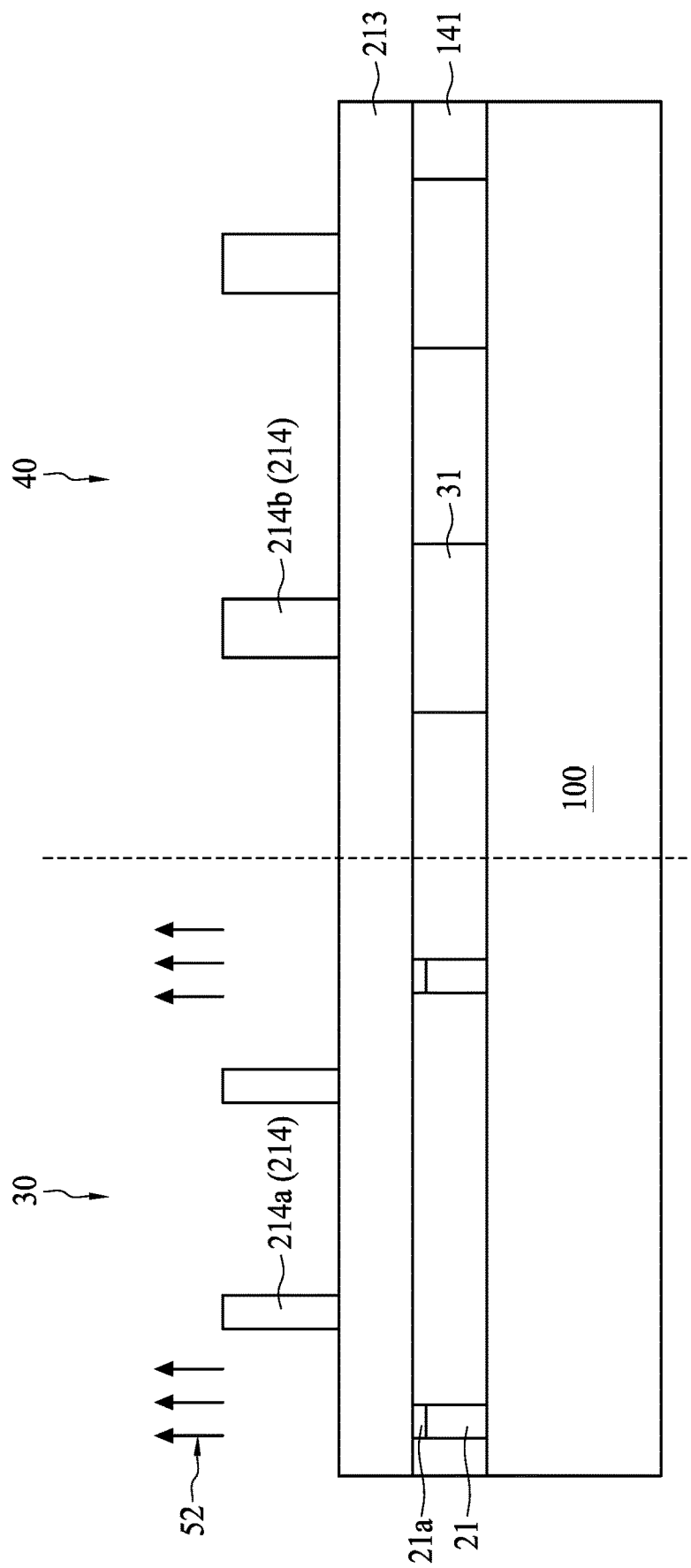

Referring to FIG. 17, which is a cross-sectional diagram taken along the line B-B' in FIG. 2 at a different stage of the method S1 in accordance with some embodiments of the present disclosure. In the step S172 of the operation S17, a second optical signal 52 is received. In some embodiments, the second optical signal 52 is a result of radiation relaxation of the excited photoluminescent sublayer 21*a*. In some embodiments, the second optical signal 52 is the radiation emitted by the photoluminescent sublayer 21*a*. In some embodiments, the second optical signal 52 is visible radiation. In some embodiments, the second optical signal 52 is non-visible radiation. The second optical signal 52 is processed by a system of the present disclosure to indicate a position of the first pattern 21 in the steps S173 to S174 and the step S178, and such system is illustrated in the following description.

Figure 18:
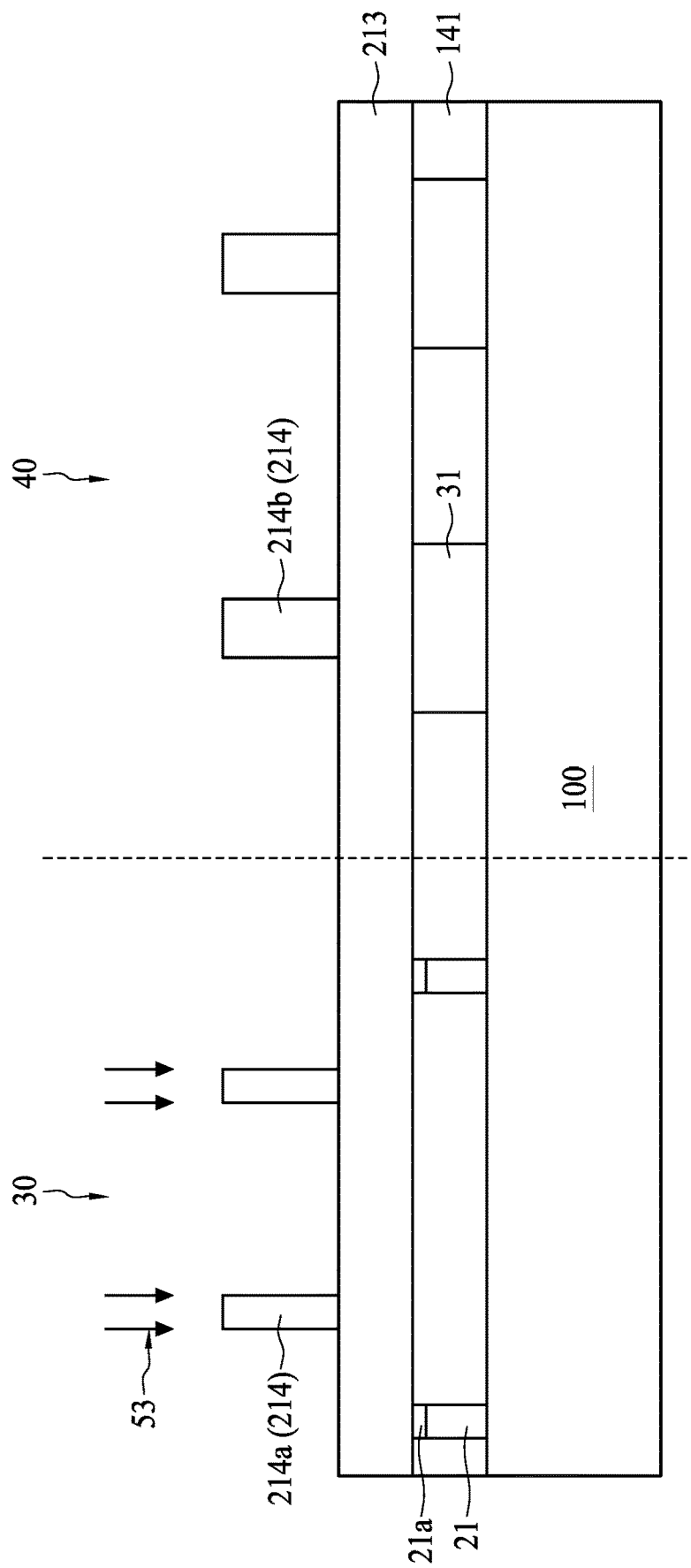

Referring to FIG. 18, which is a cross-sectional diagram taken along the line B-B' in FIG. 2 at a different stage of the method S1 in accordance with some embodiments of the present disclosure. In the step S175 of the operation S17, a third optical signal 53 is provided on the first portions 214*a* of the patterned mask layer 214. In some embodiments, the third optical signal 53 is provided on the first portions 214*a* and the second portions 214*b*. In some embodiments, the third optical signal 53 is provided on the entire substrate 100. The third optical signal 53 can be visible radiation or non-visible radiation. A wavelength of the third optical signal 53 can be within a range of wavelengths of near infrared (NIR), far infrared (FIR), ultraviolet (UV), near UV (NUV), far UV (FUV), green light, yellow light, red light, or a combination thereof. Part or all of the third optical signal 53 on the first portions 214*a* is reflected as a feedback signal.

Figure 19:
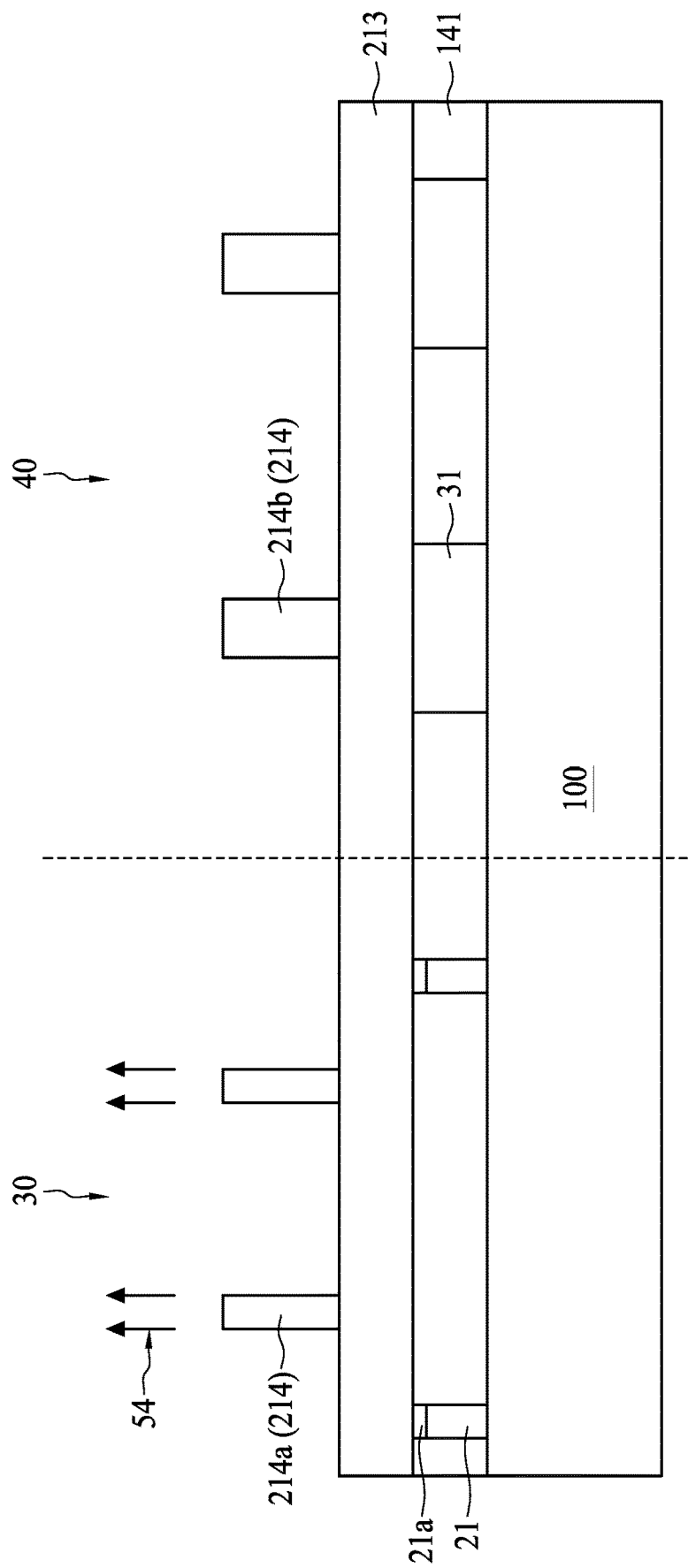

Referring to FIG. 19, which is a cross-sectional diagram taken along the line B-B' in FIG. 2 at a different stage of the method S1 in accordance with some embodiments of the present disclosure. In the step S176 of the operation S17, a fourth optical signal 54 is received. In some embodiments, the fourth optical signal 54 is the reflection or the feedback signal from the first portions 214*a* of the patterned mask layer 214. The fourth optical signal 54 is processed by the system of the present disclosure to indicate a position of the first portions 214*a* in the steps S177 to S178 of the operation S17, and such system is illustrated in the following description. In some embodiments, the second optical signal 52 and the fourth optical signal 54 are combined to examine an alignment of the first pattern 21 and the first portions 214*a*. If the alignment is precise, the method proceeds to the operation S18; alternatively, if the first pattern 21 and the first portions 214*a* are misaligned, the patterned mask layer 214 may be removed and the operation S16 is repeated.

Figure 20:
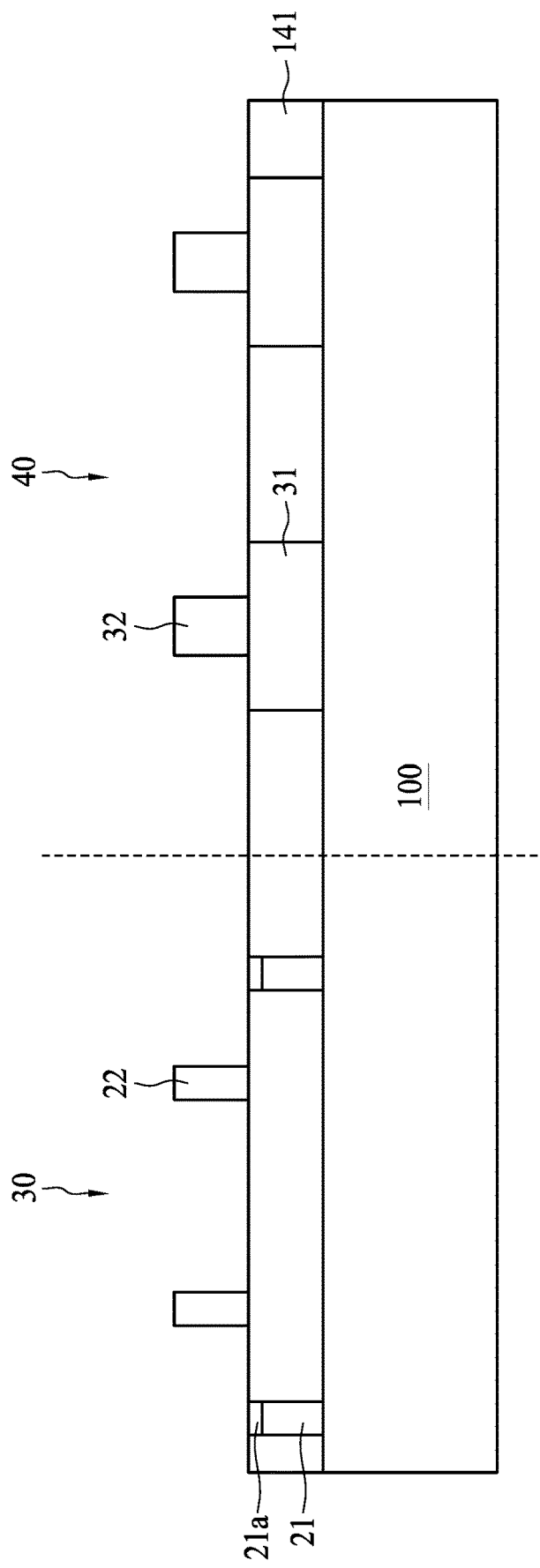

Referring to FIG. 20, which is a cross-sectional diagram taken along the line B-B' in FIG. 2 at a different stage of the method Si in accordance with some embodiments of the present disclosure. In the operation S18, a pattern of the patterned mask layer 214 is transferred to the second layer 213 to form a second pattern 22 in the scribe line region 30 and a plurality of conductive vias 32 of the interconnection structure in the device region 40. The conductive vias 32 are electrically connected to the conductive traces 31 in order to provide electrical connections. In some embodiments, the conductive vias 32 are aligned with the conductive traces 31. In some embodiments, the conductive vias 32 overlap the conductive traces 31. In some embodiments, the conductive vias 32 entirely overlap the conductive traces 31. In some embodiments, the conductive vias 32 are in physical contact with the conductive traces 31.

Conventionally, an examination of an alignment of the current layer and a pre-layer depends purely on reflection of a traditional overlay mark. A top of an overlay mark in a current layer and a top of an overlay mark in a pre-layer are detected during the examination. However, a distance between the top of the overlay mark in the current layer and the top of the overlay mark in the pre-layer may be greater than the DOF of a detector, or a thickness of one or more interlayers between the two overlay marks may be greater than the DOF of the detector. Thus, the overlay mark in the pre-layer may not be clearly or precisely detected. The present disclosure provides a structure of an overlay mark and a method of examination of the overlay mark, and the overlay mark in a pre-layer can be precisely detected. As illustrated above, in some embodiments, the distance H1 as shown in FIG. 15 is greater than 10 μm or the DOF of the detector, and the first pattern 21 can be clearly or precisely detected based on the radiation emitted from the excited fluorescent material of the photoluminescent sublayer 21*a*. In some embodiments, the photoluminescent sublayer 21*a* is formed at the bottom of the first pattern 21, and the first pattern 21 can still be clearly or precisely detected.

Figure 21:
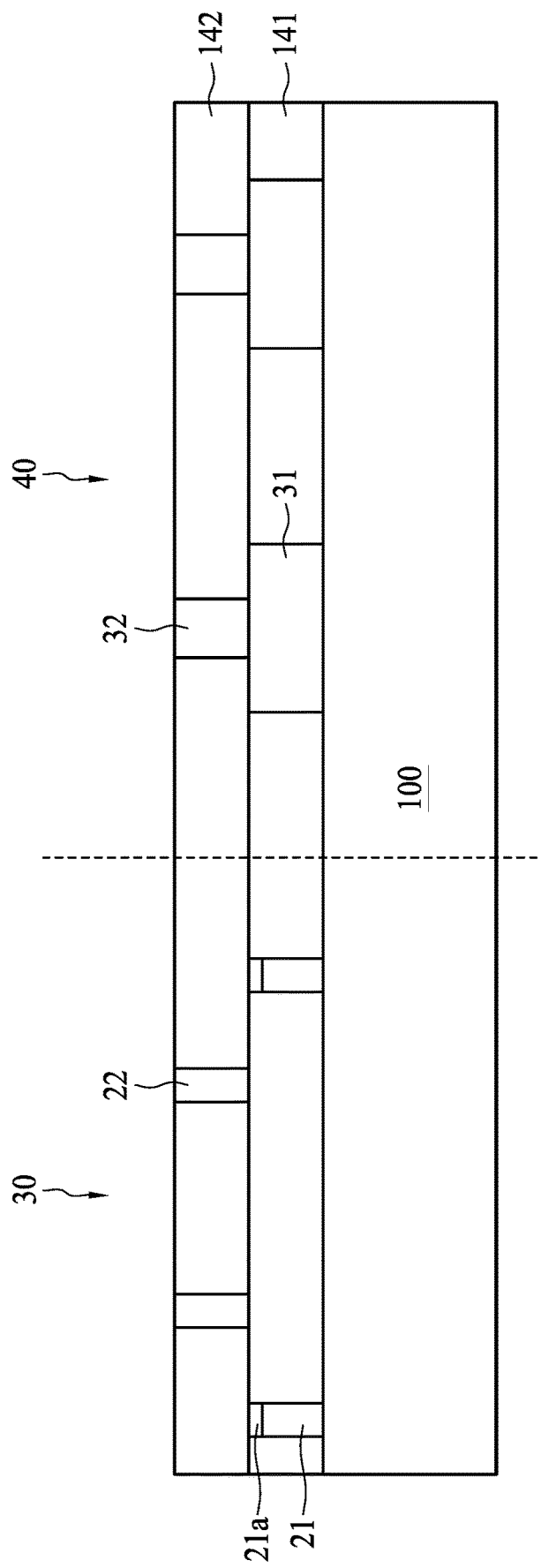

The wafer 10 may be further processed after the operation S18 of the method Si as shown in FIG. 20. Please refer to FIG. 21, which is a cross-sectional diagram taken along the line B-B' in FIG. 2 at a different stage of the method Si in accordance with some embodiments of the present disclosure. After the operation S18, an intermediate layer 142 may be formed over the substrate 100. In some embodiments, the intermediate layer 142 is a dielectric layer of the interconnection structure for providing electrical isolation between the conductive vias 32 of the interconnection structure. In some embodiments, the dielectric layer includes dielectric materials similar to or same as the dielectric materials of the isolation structure described above. In some embodiments, the intermediate layer 142 is formed by deposition. In some embodiments, a planarization is performed until the conductive vias 32 are exposed. The intermediate layer 142 may be disposed between each of the conductive vias 32, and also between the second pattern 22 and the plurality of conductive vias 32. The intermediate layer 142 may also be disposed between portions of the second pattern 22.

Figure 22:
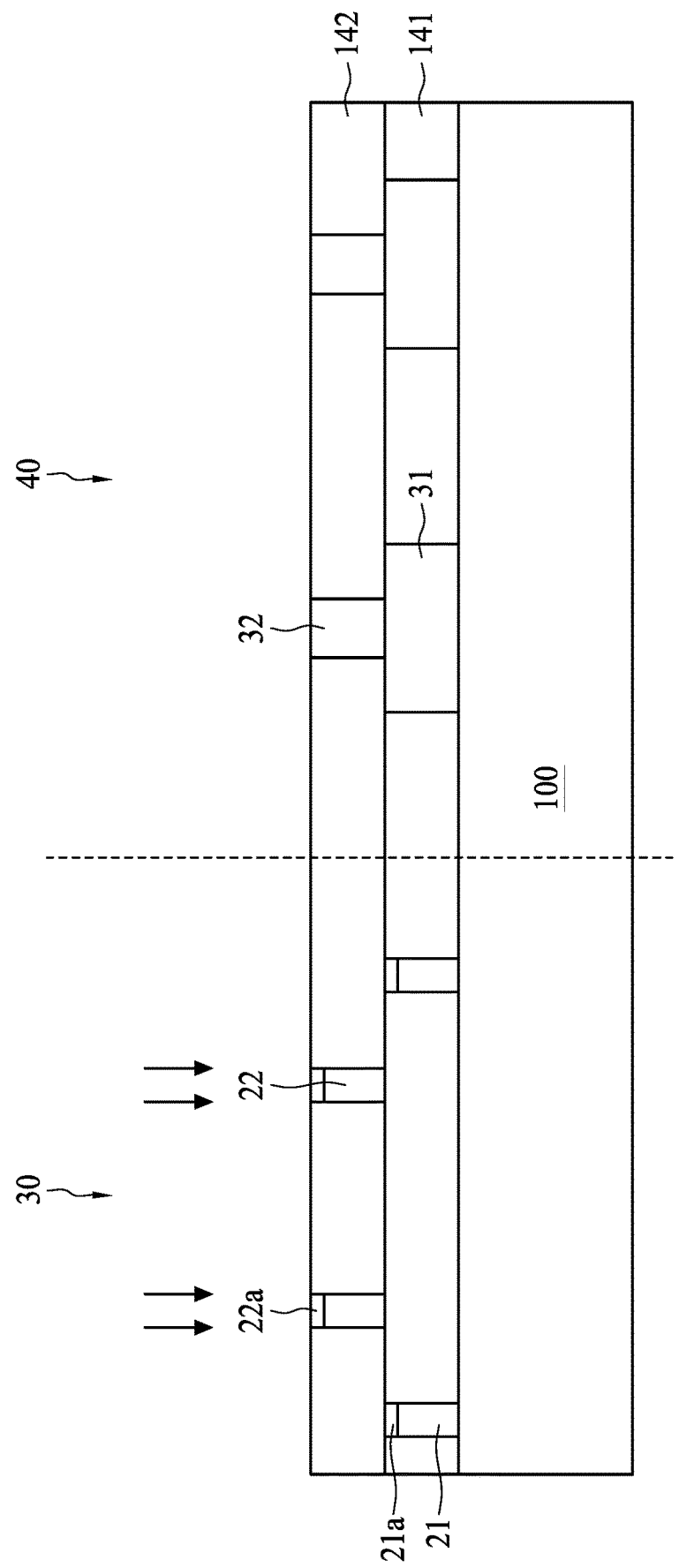

Referring to FIG. 22, which is a cross-sectional diagram taken along the line B-B' in FIG. 2 at a different stage of the method S1 in accordance with some embodiments of the present disclosure. In some embodiments, a doping operation is performed to form a photoluminescent layer 22a at a top of the overlay mark 22. A material of the photoluminescent layer 22a can be similar to or same as the material of the photoluminescent sublayer 21a, and repeated description is omitted herein. In some embodiments, a thickness of the second pattern 22 (including the photoluminescent layer 22a) is substantially equal to a thickness of one of the plurality of conductive vias 32.

Figure 23:
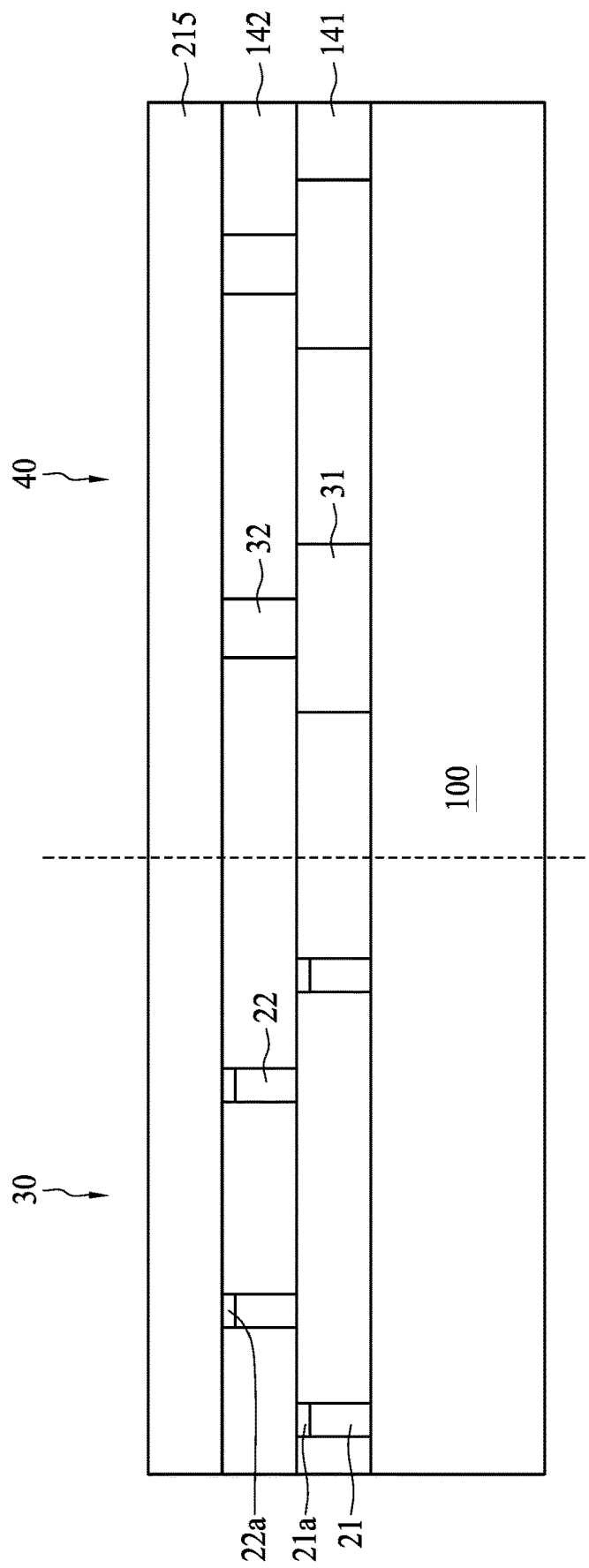

Referring to FIG. 23, which is a cross-sectional diagram taken along the line B-B' in FIG. 2 at a different stage of the method S1 in accordance with some embodiments of the present disclosure. In some embodiments, the operation S15 is performed on the intermediate layer 142, and a third layer 215 is formed over the second pattern 22. In some embodiments, the third layer 215 is formed on the intermediate layer 142 and the conductive vias 32. In some embodiments, the third layer 215 is a conductive layer. In some embodiments, the third layer 215 includes a material similar to or the same as the material of the first layer 211.

Figure 24:
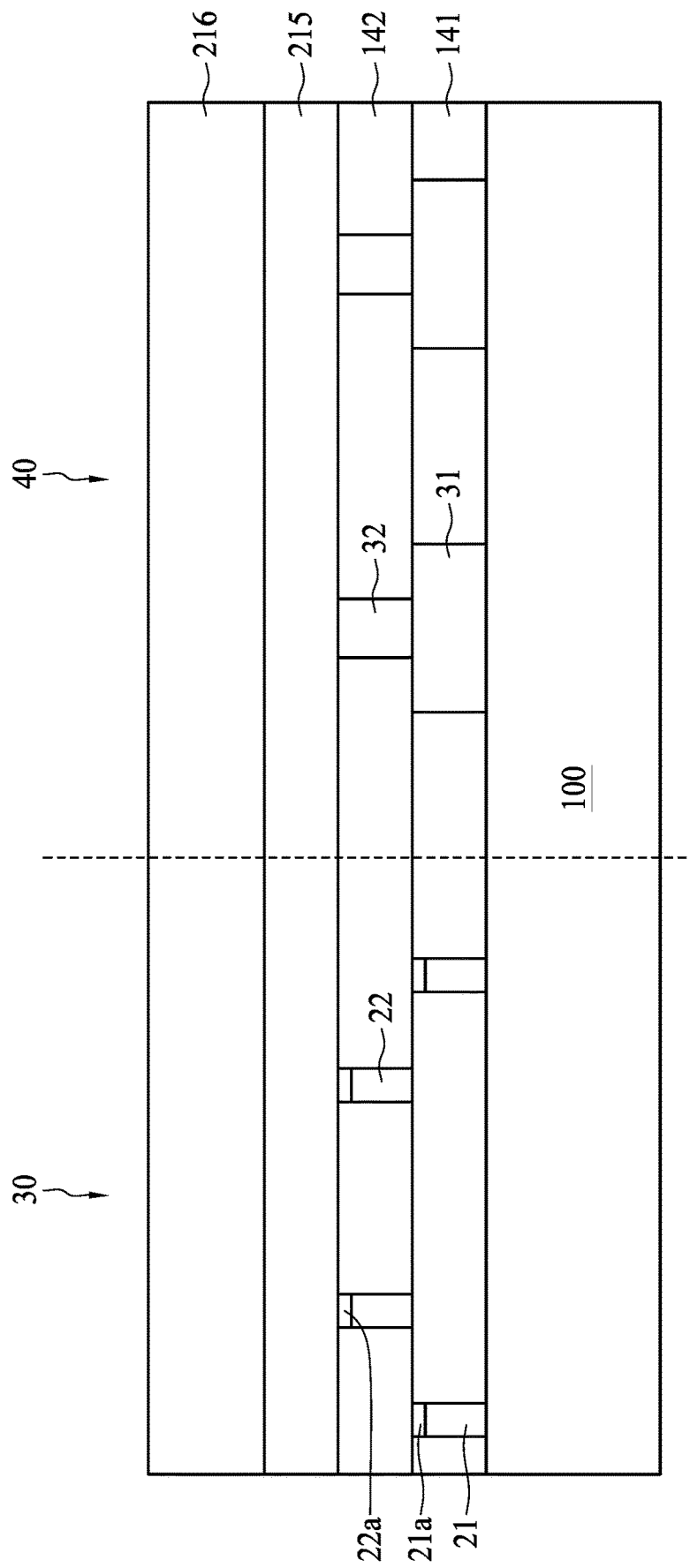
Figure 25:
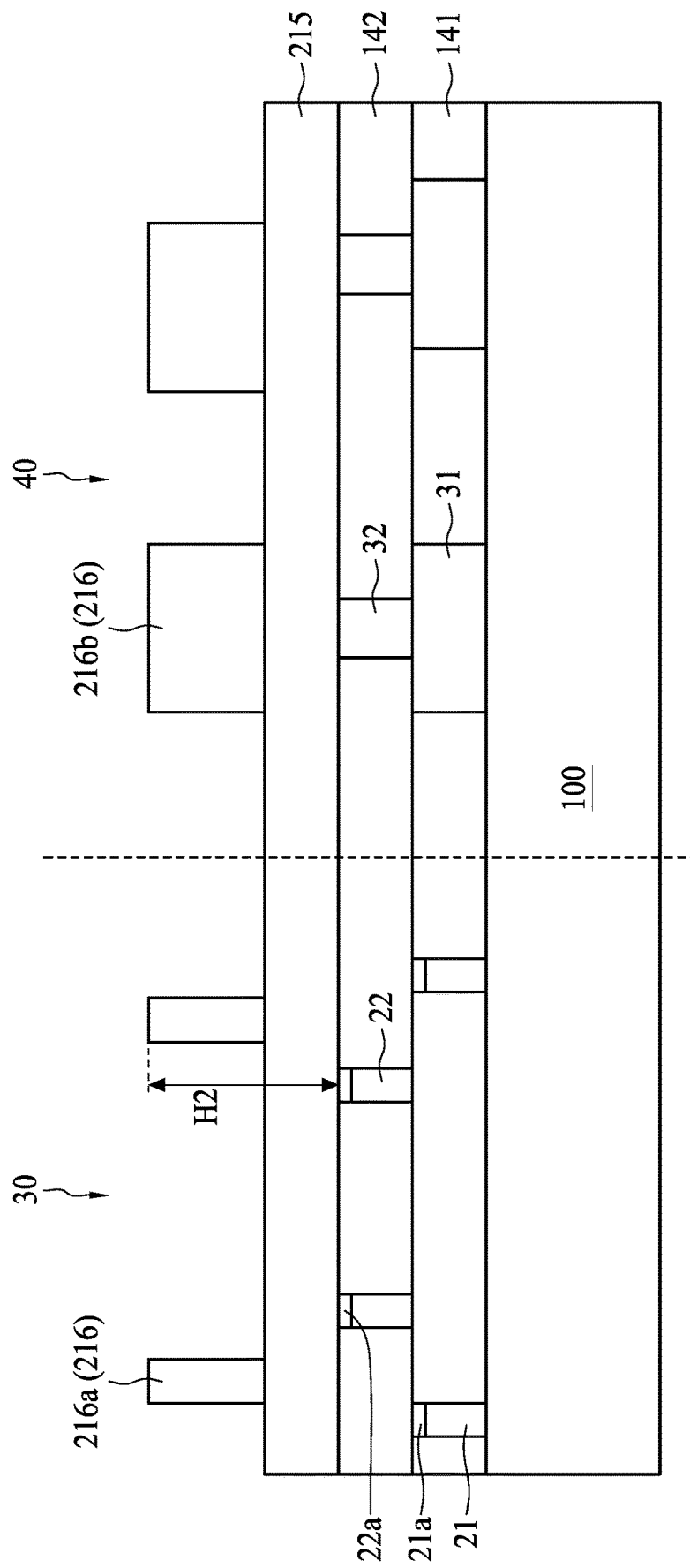

Referring to FIGS. 24 to 25, which are cross-sectional diagrams taken along the line B-B' in FIG. 2 at different stages of the method Si in accordance with some embodiments of the present disclosure. In some embodiments, the operation S16 is performed after the formation of the third layer 215, and a mask layer 216 is formed and patterned. In some embodiments, the mask layer 216 is similar to or same as the mask layer 214. In some embodiments, the patterned mask layer 216 includes first portions 216a in the scribe line region 30 and second portions 216b in the device region 40. In some embodiments, the first portions 216a may define an overlay mark to be formed in the scribe line region 30. In some embodiments, a distance H2 between a top of the first portions 216a and a top of the second pattern 22 is greater than 10 microns (μm). In some embodiments, the distance H2 is greater than the depth of focus (DOF) of a detector or an apparatus. In some embodiments, a thickness of the third layer 215 is greater than the DOF of the detector or the apparatus.

In some embodiments, the second portions 216b define conductive traces to be formed in the device region 40. In some embodiments, the first portions 216a surround the second pattern 22 from a top view perspective (not shown). In some embodiments, the first portions 216a encircle the second pattern 22 from the top view perspective.

The step S171 of the operation S17 can be performed on the second pattern 22, and the steps S172 to S174 can be sequentially performed to obtain an information of a position of the second pattern 22. The step S175 of the operation S17 can be performed on the first portions 216a of the patterned mask layer 216, and the steps S176 to S177 can be sequentially performed to obtain an information of a position of the first portions 216a of the patterned mask layer 216. The step S178 is performed to obtain an information of alignment of the second pattern 22 and the first portions 216a. If the alignment is precise, the method proceeds to the operation S18; alternatively, if the first pattern 21 and the first portions 214a are misaligned, the patterned mask layer 214 may be removed and the operation S16 is re-performed on the third layer 215.

Figure 26:
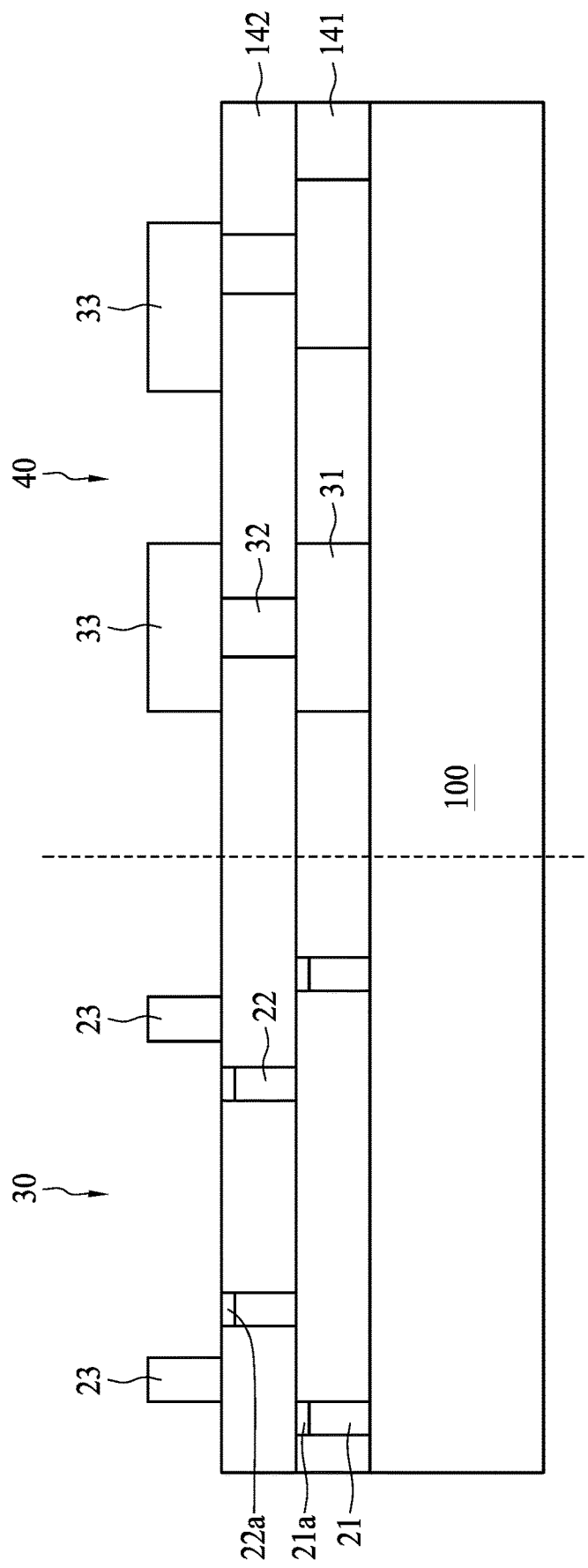

Referring to FIG. 26, which is a cross-sectional diagram taken along the line B-B' in FIG. 2 at a different stage of the method S1 in accordance with some embodiments of the present disclosure. In some embodiments, the operation S18 is performed on the third layer 215, and a pattern of the patterned mask layer 216 is transferred to the third layer 215 to form a third pattern 23 in the scribe line region 30 and a plurality of conductive traces 33 of the interconnection structure in the device region 40. The conductive traces 33 are electrically connected to the conductive vias 32 in order to provide electrical connections. In some embodiments, the conductive traces 33 are aligned with the conductive vias 32. In some embodiments, the conductive traces 33 overlap the conductive vias 32. In some embodiments, the conductive vias 32 entirely overlap the conductive traces 33. In some embodiments, the conductive traces 33 are in physical contact with the conductive vias 33.

The first pattern 21 functions as an overlay mark of a pre-layer (e.g., a layer of the conductive traces 31) during an examination of alignment of the conductive vias 32 and the conductive traces 31 prior to a patterning operation for forming the conductive vias 32. The second pattern 22 is formed by the patterning operation and functions as an overlay mark of a pre-layer (e.g., a layer of the conductive vias 32) during the examination of alignment of the conductive traces 33 and the conductive vias 32 prior to a patterning operation for forming the conductive traces 33. The operations shown in FIGS. 21 to 26 can be repeatedly performed to form the interconnection structure.

It should be noted that formation of an interconnection of a semiconductor structure is described above as an exemplary embodiment for a purpose of illustration. The photoluminescent sublayer can be applied in an overlay mark of any layer of a semiconductor structure that requires an alignment examination.

In order to perform the method S1, especially the detection of the operation S17 for alignment examination, the disclosure provides a system for forming a semiconductor structure.

Figure 27:
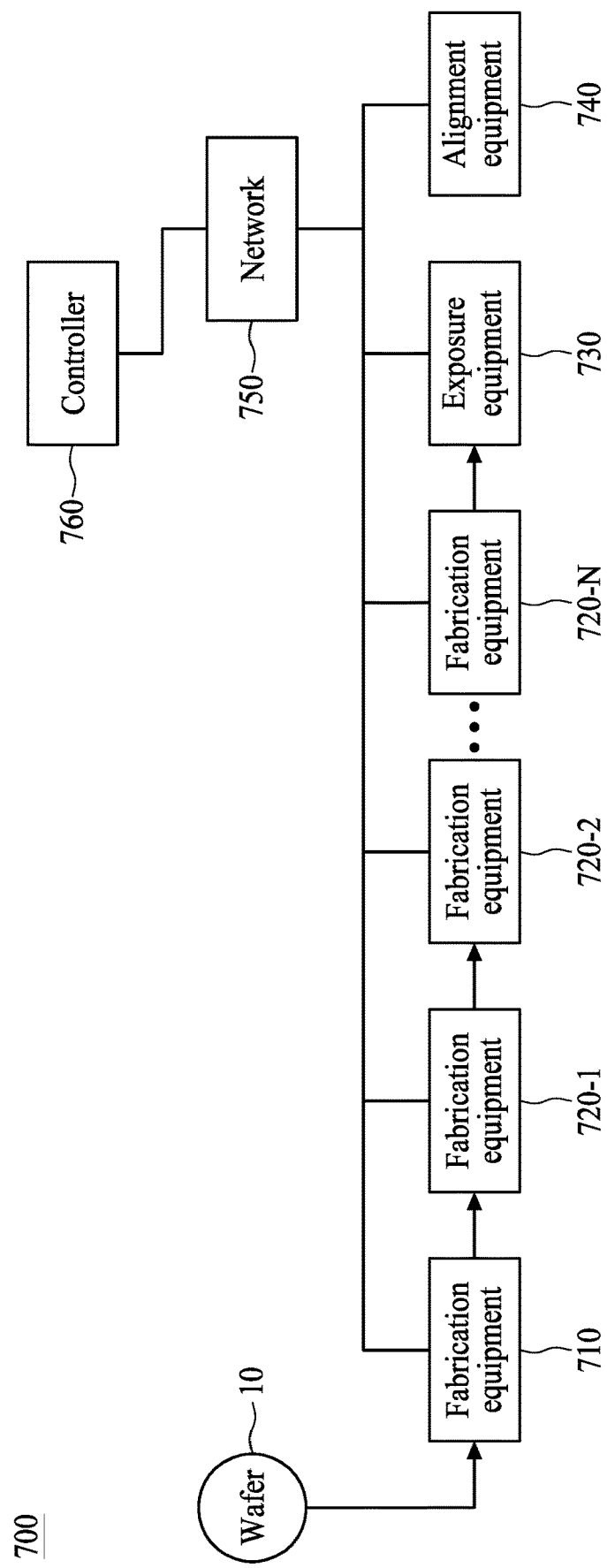
FIG. 27 is a block diagram of a semiconductor fabrication system in accordance with some embodiments of the present disclosure.

Referring to FIG. 27, which is a block diagram illustrating a semiconductor fabrication system 700, in accordance with some embodiments of the present disclosure.

The semiconductor fabrication system 700 can include a plurality of fabrication equipment 710, 720-1, 720-2, ..., and 720-N, an exposure equipment 730, and an alignment equipment 740. The fabrication equipment 710, 720-1, 720-2, ..., and 720-N, the exposure equipment 730, and the alignment equipment 740 can be coupled to a controller 760 through a network 750.

The fabrication equipment 710 can be configured to perform operations in order to form a layer or a structure on a wafer 10. In some embodiments, the fabrication equipment 710 may be configured to form an isolation structure, a gate structure, and conductive layers of a semiconductor structure. The fabrication equipment 720-1, 720-2, ..., and 720-N can be configured to form layers of an interconnect structure, such as the first layer 211, the photoluminescent layer 212, the second layer 213, the mask layer 214, the third layer 215 and the mask layer 216 shown in FIGS. 9 to 24. Each piece of the fabrication equipment 720-1, 720-2, ..., and 720-N can be configured to perform a deposition process, an etching process, a chemical mechanical polishing process, a photoresist coating process, a baking process, an alignment process, or other processes.

The exposure equipment 730 can be configured to perform patterning operations to form, for instance, the first pattern 21, the second pattern 22, the conductive traces 31, the conductive vias 32 and the conductive traces 33 as shown in FIGS. 11 to 26.

The alignment equipment 740 can be configured to generate an alignment result of two overlay marks at different elevations. The alignment equipment 740 can be configured to obtain an optical image of a pattern (e.g., the first pattern 21) of a pre-layer and a pattern (e.g., the first portions 214*a*) of a current layer, and to generate an alignment result based on the aforesaid optical images of the patterns of the pre-layer and the current layer.

The network 750 can be the internet or an intranet implementing network protocols such as transmission control protocol (TCP). Through the network 750, each of the fabrication equipment 710, 720-1, 720-2, . . . , and 720-N, the exposure equipment 730 and the alignment equipment 740 may download or upload work in progress (WIP) information regarding the wafer 10 or the fabrication equipment from or to the controller 760. In some embodiments, each of the fabrication equipment 710, 720-1, 720-2, . . . , and 720-N, the exposure equipment 730 and the alignment equipment 740 is electrically connected to the network 750. In some embodiments, each of the fabrication equipment 710, 720-1, 720-2, . . . , and 720-N, the exposure equipment 730 and the alignment equipment 740 is signally connected to the network 750.

The controller 760 is configured to control the fabrication of the semiconductor structure or the wafer 10. The controller 760 can be electrically or signally connected to each of the fabrication equipment 710, 720-1, 720-2, . . . , and 720-N, the exposure equipment 730 and the alignment equipment 740. A position and status of the wafer 10 can be sent to the controller 760. The controller 760 can include a processor, such as a central processing unit (CPU). In some embodiments, the controller 760 can generate an alignment result based on data from the alignment equipment 740. In some embodiments, the alignment result is generated by another controller in the alignment equipment 740, and the controller 760 can receive the alignment result from the alignment equipment 740. In some embodiments, the controller 760 can proceed the fabrication of the wafer 10 to a next stage of the method if the alignment result is positive or the alignment is precise.

In the exemplary embodiments, a wafer 10 is transferred to the fabrication equipment 710 to start a sequence of different processes. The wafer 10 may be processed according to various stages of the method to form at least one layer of material. The exemplary embodiments are not intended to limit the processes performed on the wafer 10. In other exemplary embodiments, the wafer 10 may include various layers, and any stages of the method may be performed between a beginning and a completion of a product, before the wafer 10 is transferred to the fabrication equipment 710. In the exemplary embodiments, the wafer 10 can be processed by the fabrication equipment 710, 720-1, 720-2, . . . , and 720-N, the exposure equipment 730 and the alignment equipment 740 in a sequential order.

Although FIG. 27 does not show any fabrication equipment before the fabrication equipment 710, the exemplary embodiment is not intended to be limiting. In other exemplary embodiments, various kinds of fabrication equipment can be utilized before the fabrication equipment 710, and can be used to perform various processes according to design requirements.

The alignment equipment 740 can include several units or components. In some embodiments, the alignment equipment 740 is referred to as an alignment examination system 740.

Figure 28:
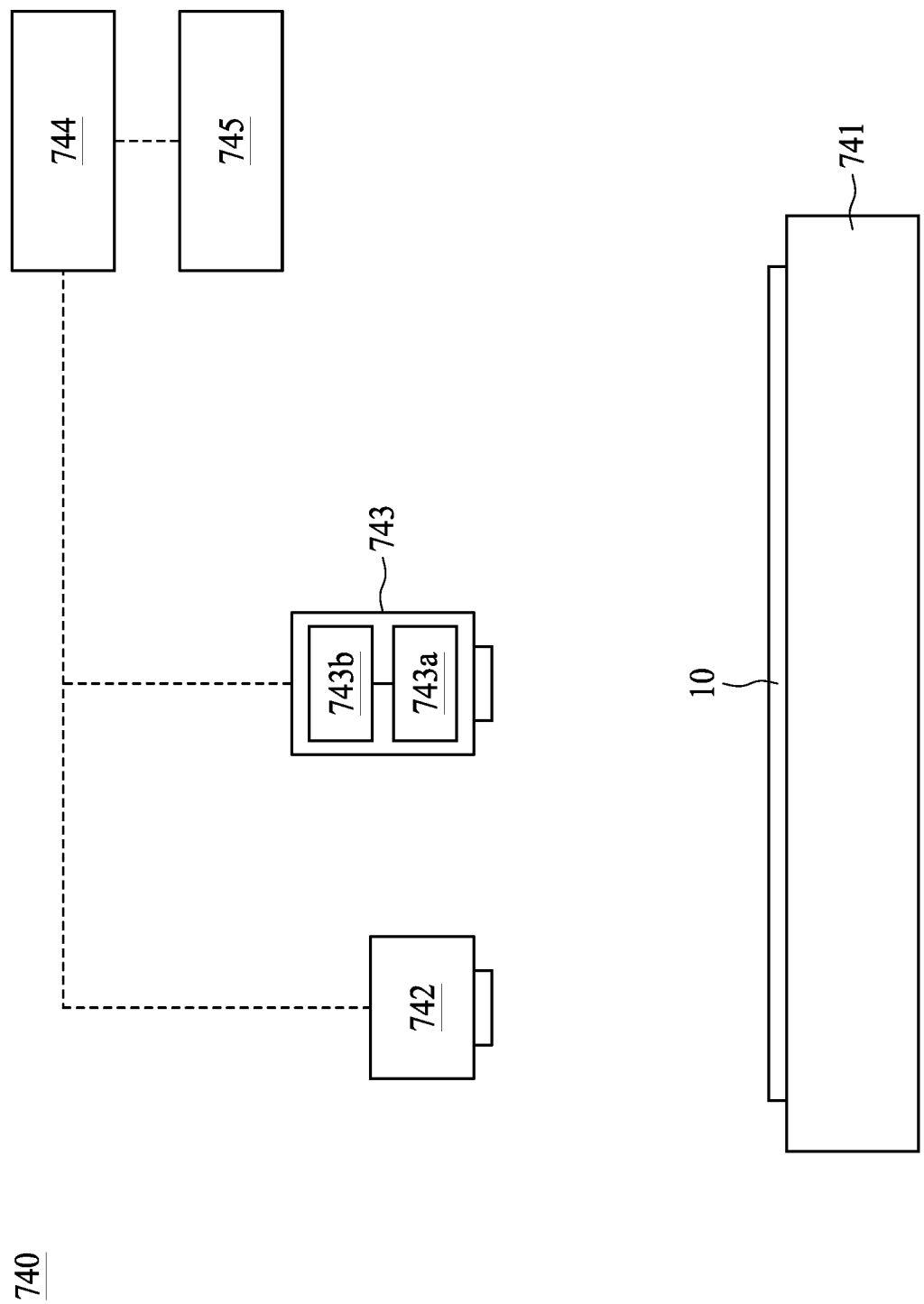
FIG. 28 is a schematic diagram of an alignment equipment of the semiconductor fabrication system shown in FIG. 27 in accordance with some embodiments of the present disclosure.

Referring to FIG. 28, which is a schematic diagram of the alignment equipment 740 in accordance with some embodiments of the present disclosure. In some embodiments, the alignment equipment 740 includes a stage 741, an optical device 742, a detecting unit 743, a controller 744, and an interface 745.

The stage 741 may be configured to support a wafer 10 to undergo an alignment detection and/or an alignment examination. In some embodiments, the wafer 10 is transferred to the alignment equipment 740 after the operation S16 for performing the operation S17. In some embodiments, the wafer 10 is transferred from the exposure equipment 730 or one of the fabrication equipment 720-1 to 720-N. In some embodiments, the wafer 10 is transferred into the alignment equipment 740 and disposed on the stage 741.

The optical device 742 may be configured to emit a radiation or an optical signal for exciting a photoluminescent material of an overlay mark in a scribe line region 30 of the wafer 10. In some embodiments, the radiation is the first optical signal 51 shown in FIG. 16. In some embodiments, the radiation is the optical signal provided on the second pattern 22 shown in FIG. 25. In some embodiments, the radiation is provided on the photoluminescent material of the overlay mark of a pre-layer in the scribe line region 30. In some embodiments, the radiation is provided in both the scribe line region 30 and a device region 40. In some embodiments, the radiation is provided on the entire wafer 10. A wavelength of the radiation can be within a range of near infrared (NIR), far infrared (FIR), ultraviolet (UV), near UV (NUV), far UV (FUV), green light, yellow light, red light, or a combination thereof. The photoluminescent material is excited by the radiation. Electrons of the excited photoluminescent material return to ground states from excited states, and a radiation is emitted on the return of the electrons to the ground state.

The detecting unit 743 is configured to detect the radiation emitted from the photoluminescent material of the overlay mark on the wafer 10. In some embodiments, the detecting unit 743 includes an optical filter 743*a* and an optical detector 743*b*. The optical filter 743*a* may be configured to receive and filter the radiation emitted from the photoluminescent material, and the optical detector 743*b* may be configured to convert an optical signal filtered by the optical filter to an electrical signal.

Figure 29:
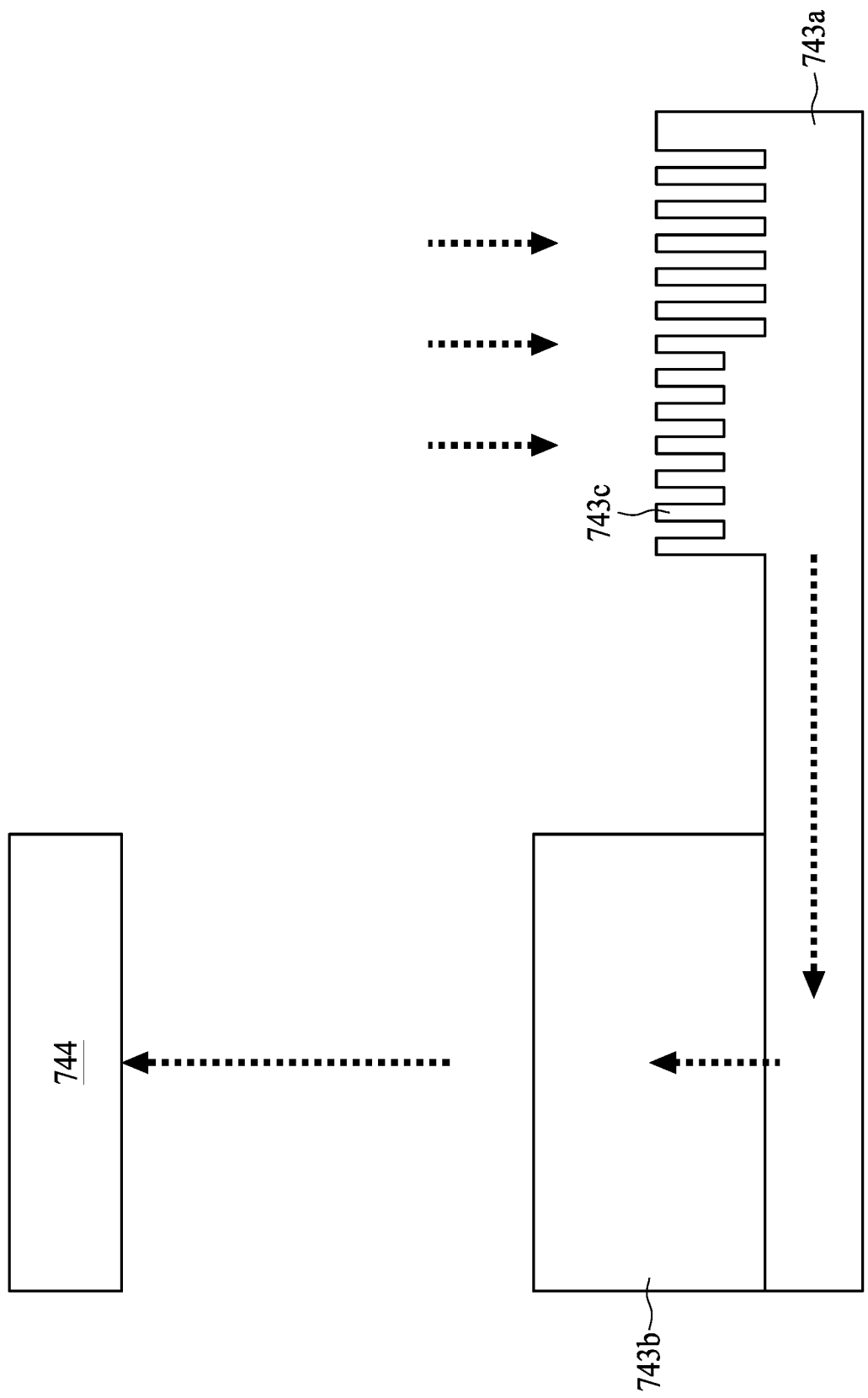
FIG. 29 is a schematic diagram of a detecting unit of the alignment equipment shown in FIG. 28 in accordance with some embodiments of the present disclosure.

Referring to FIG. 29, which is a schematic diagram of the optical unit 743 in accordance with some embodiments of the present disclosure. In some embodiments, the optical filter 743*a* is a waveguide. In some embodiments, the optical filter 743*a* includes a grating structure 743*c*. The grating structure 743*c* can be for the radiation entering through. In some embodiments, the grating structure includes a semiconductive material. In some embodiments, the grating structure is formed in a semiconductor substrate. The radiation emitted from the photoluminescent material of the overlay mark on the wafer 10 is received by the optical filter 743*a*. The radiation may enter the grating structure and travel within the semiconductive material of the optical filter 743*a*. The radiation can be redirected and transmitted to the optical detector 743*b*. In some embodiments, the optical filter 743*a* and the optical detector 743*b* are formed in a same semiconductor substrate. In some embodiments, the optical detector 743b and the optical filter 743a are two semiconductor devices bonded on a same substrate. In some embodiments, the optical filter 743a and the optical detector 743b are included in a same semiconductor package. The radiation or optical signal from the optical filter 743a is received and converted to an electrical signal by the optical detector 743b. The electrical signal is output from the optical detector 743b and sent to the controller 744, and a data of the overlay mark having the photoluminescent material is generated.

In some embodiments, the radiation required for excitation of the photoluminescent material has a wavelength different from a wavelength of the radiation emitted as a result of the relaxation of the electrons of the photoluminescent material. In some embodiments, a filtration range of wavelengths of the optical filter 743a is different from a range of wavelengths of radiations generated by the optical device 742. A wavelength of the radiation generated by the optical device 742 can be adjusted according to the photoluminescent material. The filtration range of the wavelengths of the optical filter 743a can also be adjusted according to the photoluminescent material. In some embodiments, the grating structure 743c of the optical filter 743a includes different depths for filtering different ranges of wavelengths of radiations. The different radiations are converted into different electrical signals by the optical detector 743b, and the electrical signals can then be processed and categorized by the controller 744. In some embodiments, only the electrical signals corresponding to a desired range of wavelengths are used in an alignment result.

Referring back to FIG. 28. The controller 744 can be electrically or signally connected to the optical device 742 and the detecting unit 743. The controller 744 can be configured to process the electrical signal from the optical detector 743b of the detecting unit 743. In some embodiments, the controller 744 receives the electrical signal from the detecting unit 743. The electrical signal is processed by the controller 744 to generate a data showing a position of the overlay mark in the scribe line region 30 on the wafer 10. In some embodiments, the controller 744 can include a processer, such as a central processing unit (CPU). In some embodiments, the controller 744 is a logic device. In some embodiments, the data can be displayed on the interface 745. The interface 745 can be electrically or signally connected to the controller 744.

In some embodiments, the optical device 742 generates another radiation targeting a different overlay mark (e.g., in the current layer). The process as illustrated above is repeated on the different overlay mark. A data of the different overlay mark can be generated and combined with the overlay mark (e.g., in the pre-layer) detected previously. An alignment result can then be generated by the controller 744 by combining and processing the two data of the two different overlay marks at different elevations. In some embodiments, the alignment equipment 740 does not have a controller. In some embodiments, the electrical signal output from the detecting unit 743 is transmitted to the controller 760 shown in FIG. 27. The controller 760 can function like the controller 744 to process the electrical signal and generate an alignment result.

One aspect of the present disclosure provides a method of forming a semiconductor structure. The method includes providing a substrate, including a device region and a scribe line region surrounding the device region; forming a first layer over the substrate; forming a first photoluminescent layer over the first layer in the scribe line region; patterning the first layer and the first photoluminescent layer to form a first pattern in the scribe line region; forming a first patterned mask layer over a second layer; detecting an alignment of the first patterned mask layer and the first pattern; and transferring a pattern of the first patterned mask layer to the second layer to form a second pattern in the scribe line region.

Another aspect of the present disclosure provides a system for forming a semiconductor structure. The system includes: a fabrication equipment, configured to perform operations to form a layer on a wafer; an exposure equipment, configured to perform patterning operations to form a pattern of the layer; and an alignment equipment, configured to detect an alignment of two overlay marks at different elevations. The alignment equipment comprises: a stage, configured to support a semiconductor structure; an optical device, configured to emit a radiation to excite a photoluminescent material of an overlay mark in a scribe line region of the semiconductor structure; an optical filter, configured to receive and filter a radiation emitted from the photoluminescent material; and an optical detector, configured to convert an optical signal filtered by the optical filter to an electrical signal.

Another aspect of the present disclosure provides a semiconductor structure. The structure includes: a substrate, including a scribe line region and a device region; a first patterned layer, disposed over the substrate, wherein portions of the first patterned layer in the scribe line region define a first pattern and portions of the first patterned layer in the device region define a plurality of conductive traces; a first photoluminescent layer disposed at a top of the first pattern; and a second patterned layer, disposed over the first patterned layer, wherein portions of the second patterned layer in the scribe line region define a second pattern and portions of the second patterned layer in the device region define a plurality of conductive vias. The first photoluminescent layer is exposed through the second patterned layer from a top view perspective, and the plurality of conductive vias are electrically connected to the plurality of conductive traces.

In conclusion, the application discloses a semiconductor structure, a method for forming the semiconductor structure, and a system for performing the method. A photoluminescent layer is included in an overlay mark, and a detection of the overlay mark of a pre-layer is improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A system for manufacturing a semiconductor structure, comprising:
- a fabrication equipment, configured to perform operations to form a layer on a wafer;
- an exposure equipment, configured to perform patterning operations to form a pattern of the layer; and
- an alignment equipment, configured to detect an alignment of two overlay marks at different elevations, the alignment equipment comprising:
- a stage, configured to support a semiconductor structure;
- an optical device, configured to emit a radiation to excite a photoluminescent material of an overlay mark in a scribe line region of the semiconductor structure;
- an optical filter, configured to receive and filter a radiation emitted from the photoluminescent material; and
- an optical detector, configured to convert an optical signal filtered by the optical filter to an electrical signal;
- wherein a filtration range of wavelengths of the optical filter is different from a range of wavelengths of radiations emitted from the optical device.

2. The system of claim 1, wherein the alignment equipment is configured to generate an alignment result of the two overlay marks.

3. The system of claim 1, wherein the alignment equipment further comprises:
- a controller, electrically or signally connected to the optical device and the optical detector, and configured to process the electrical signal from the optical detector.

4. The system of claim 1, wherein the alignment equipment further comprises:
- an interface, electrically connected to the controller and configured to display a result of the electrical signal after processing by the controller.

5. The system of claim 1, wherein the optical filter includes a grating structure for the radiation entering through.

6. The system of claim 1, wherein the optical detector outputs the electrical signal to a controller.

7. The system of claim 1, wherein the optical device emits the radiation having a wavelength in a range of near infrared (NIR), far infrared (FIR), ultraviolet (UV), near UV (NUV), far UV (FUV), green light, yellow light, red light, or a combination thereof.

8. The system of claim 1, further comprising:
- a network, signally or electrically connected to the fabrication equipment, the exposure equipment, and the alignment equipment.

9. The system of claim 1, further comprising:
- a controller, electrically or signally connected to the fabrication equipment, the exposure equipment and the alignment equipment.

10. The system of claim 9, wherein the controller is configured to generate an alignment result based on the electrical signal from the optical detector.

* * * * *